United States Patent
Iwanaga et al.

(10) Patent No.: US 10,353,013 B2
(45) Date of Patent: Jul. 16, 2019

(54) VOLTAGE DETECTION DEVICE, VOLTAGE DETECTION METHOD, ABNORMALITY DETERMINATION DEVICE, ABNORMALITY DETERMINATION METHOD, AND BATTERY PACK SYSTEM

(71) Applicant: FUJITSU TEN LIMITED, Kobe-shi, Hyogo (JP)

(72) Inventors: Takehito Iwanaga, Kobe (JP); Atsushi Izutani, Kobe (JP); Akihito Kondo, Toyotacity (JP); Kazuya Ogawa, Kobe (JP)

(73) Assignee: FUJITSU TEN LIMITED, Kobe (JP)

( * ) Notice: Subject to any disclaimer, the term of this patent is extended or adjusted under 35 U.S.C. 154(b) by 598 days.

(21) Appl. No.: 15/053,546

(22) Filed: Feb. 25, 2016

(65) Prior Publication Data
US 2016/0252584 A1    Sep. 1, 2016

(30) Foreign Application Priority Data

Feb. 27, 2015 (JP) .................................. 2015-039204
Feb. 27, 2015 (JP) .................................. 2015-039205

(51) Int. Cl.
*G01R 31/396* (2019.01)
*G01R 31/327* (2006.01)
*G01R 31/3835* (2019.01)

(52) U.S. Cl.
CPC ....... *G01R 31/396* (2019.01); *G01R 31/3277* (2013.01); *G01R 31/3835* (2019.01)

(58) Field of Classification Search
CPC .................. G01R 31/3658; G01R 31/3277
See application file for complete search history.

(56) References Cited

U.S. PATENT DOCUMENTS

2005/0206386 A1*  9/2005  Ishikawa ............ G01R 19/2503
                                                    324/416
2009/0179650 A1*  7/2009  Omagari ............ G01R 31/3624
                                                    324/433

FOREIGN PATENT DOCUMENTS

JP  2008-079415 A  4/2008
JP  2009-092465 A  4/2009
(Continued)

OTHER PUBLICATIONS

Oct. 23, 2018 Office Action issued in Japanese Patent Application No. 2015-039204.

*Primary Examiner* — Daniel R Miller
(74) *Attorney, Agent, or Firm* — Oliff PLC

(57) ABSTRACT

A voltage detection device includes battery stacks, and a connection member configured to electrically connect the battery stacks. The voltage detection device includes: a capacitor connected to each battery stack in parallel; switches, each of which having one end connected to a terminal of each battery stack and the other end connected to the capacitor; a detection unit configured to detect a voltage of the capacitor, and a control unit configured to control the switches, in which the control unit comprises: a discharging path selection unit that selects a discharging path comprising the connection member and the capacitor when discharging the capacitor, and a determination unit configured to determine whether an abnormality has occurred in the battery pack or at least one of the switches, in correspondence to at least one of a voltage of the capacitor after charging and a voltage of the capacitor after discharging.

16 Claims, 28 Drawing Sheets

(56) References Cited

FOREIGN PATENT DOCUMENTS

| | | |
|---|---|---|
| JP | 2013-219955 A | 10/2013 |
| JP | 2014-157075 A | 8/2014 |
| JP | 2014-183671 A | 9/2014 |
| JP | 2015-083960 A | 4/2015 |

\* cited by examiner

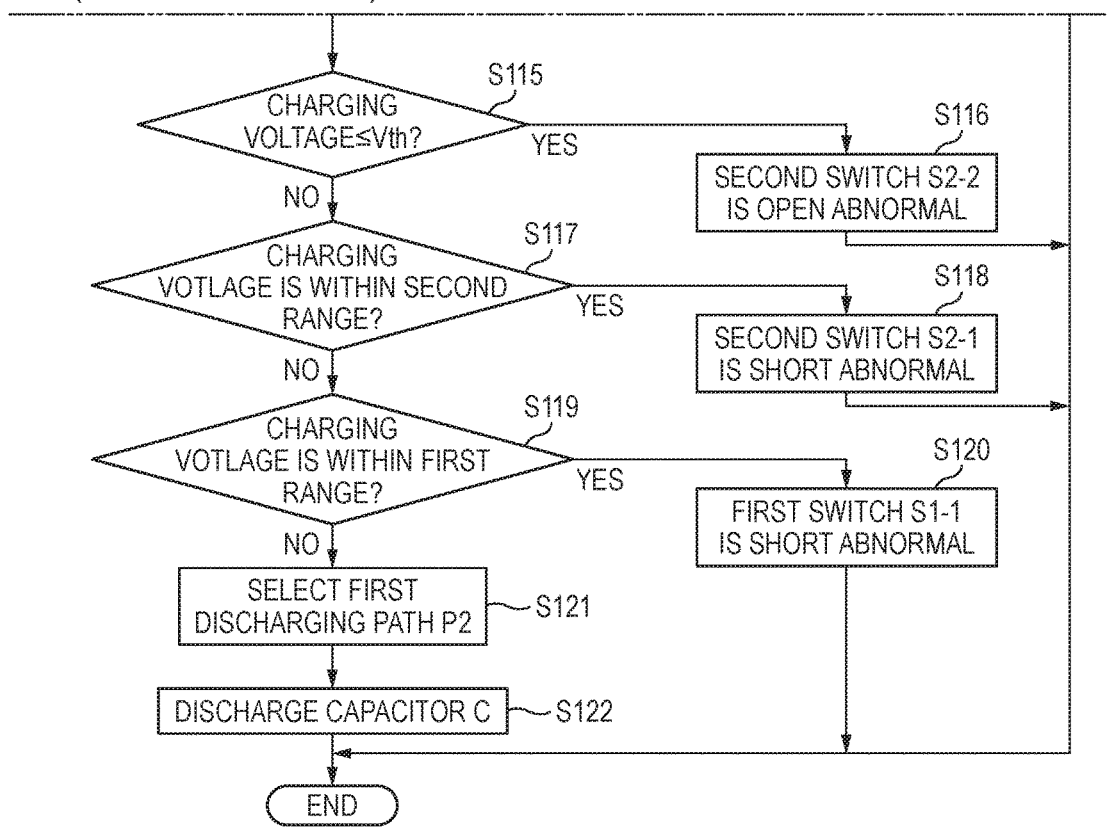

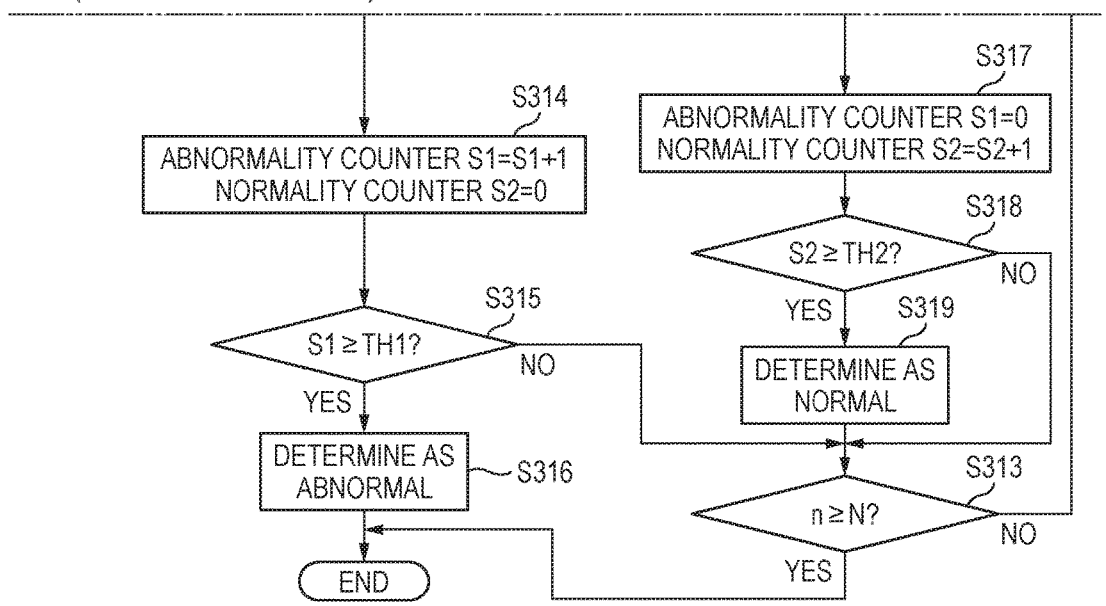

US 10,353,013 B2

VOLTAGE DETECTION DEVICE, VOLTAGE DETECTION METHOD, ABNORMALITY DETERMINATION DEVICE, ABNORMALITY DETERMINATION METHOD, AND BATTERY PACK SYSTEM

CROSS-REFERENCE TO RELATED APPLICATIONS

This application is based on and claims priority under 35 USC 119 from Japanese Patent Application No. 2015-039204 filed on Feb. 27, 2015 and Japanese Patent Application No. 2015-039205 filed on Feb. 27, 2015, the entire contents of which are incorporated herein by reference.

BACKGROUND

1. Technical Field

The present invention relates to a voltage detection device, a voltage detection method, an abnormality determination device, an abnormality determination method and a battery pack system.

2. Related Art

A battery pack in which battery stacks, each of which has a plurality of battery cells connected in series, are connected in series has been used as a power supply of an electric vehicle and a hybrid electric vehicle, for example. The battery pack is connected with a monitoring device configured to monitor the battery pack. The monitoring device is configured to operate as a voltage detection device configured to detect a voltage of the battery pack and an abnormality determination device configured to determine whether an abnormality has occurred in the battery pack or the monitoring device.

As the abnormality to occur in the battery pack, a so-called open abnormality has been known in which a connection member configured to connect two adjacent battery stacks is disconnected and an open state is thus made between terminals of the two battery stacks. In the abnormality detection device of the related art, a Zener diode is provided on a bypath route configured to connect both ends of the connection member so as to detect the open abnormality between the battery stacks (for example, refer to Patent Document 1 (JP-A-2014-183671)).

Also, as a device configured to determine whether an abnormality has occurred in an electric pathway of the voltage detection device, a device having two voltage detection circuits has been known (for example, refer to Patent Document 2 (JP-A-2008-79415)). In this device, it is determined whether an abnormality has occurred in the electric pathway, based on voltages detected by the two voltage detection circuits.

SUMMARY OF INVENTION

However, according to the devices of the related art, the Zener diode or the plurality of voltage detection circuits is required so as to detect the abnormality, which increases the number of components. When the number of components increases, a circuit scale and the manufacturing cost also increase.

In view of above, at least one embodiment of the present invention provides an art capable of suppressing increase in the number of components.

At least one embodiment of the present invention provides a voltage detection device configured to detect a voltage of a battery stack of a battery pack including a plurality of battery stacks, each of which having a plurality of battery cells connected in series, and a connection member configured to electrically connect the plurality of battery stacks. The voltage detection device has a capacitor, a plurality of switches, a detection unit and a control unit. Also, the control unit has a discharging path selection unit and a determination unit. The capacitor is connected to each of the plurality of battery stacks in parallel. Each of the plurality of switches has one end connected to a terminal of each of the plurality of battery stacks and the other end connected to the capacitor. The detection unit is configured to detect a voltage of the capacitor. The control unit is configured to control the plurality of switches. The discharging path selection unit selects a discharging path including the connection member and the capacitor when discharging the capacitor. The determination unit is configured to determine whether an abnormality has occurred in the battery pack or at least one of the plurality of switches, in correspondence to at least one of a voltage of the capacitor after charging and a voltage of the capacitor after discharging.

According to the at least one embodiment of the present invention, it is possible to suppress the increase in the number of components of the circuit.

DESCRIPTION OF EMBODIMENTS

Hereinafter, illustrative embodiments of the voltage detection device, the voltage detection method and the battery pack system of the disclosure will be described in detail with reference to the accompanying drawings. In the meantime, it should be noted that the disclosure is not limited to the illustrative embodiments.

A. First Illustrative Embodiment

A1. Configuration of Battery Pack System

Figure 1:
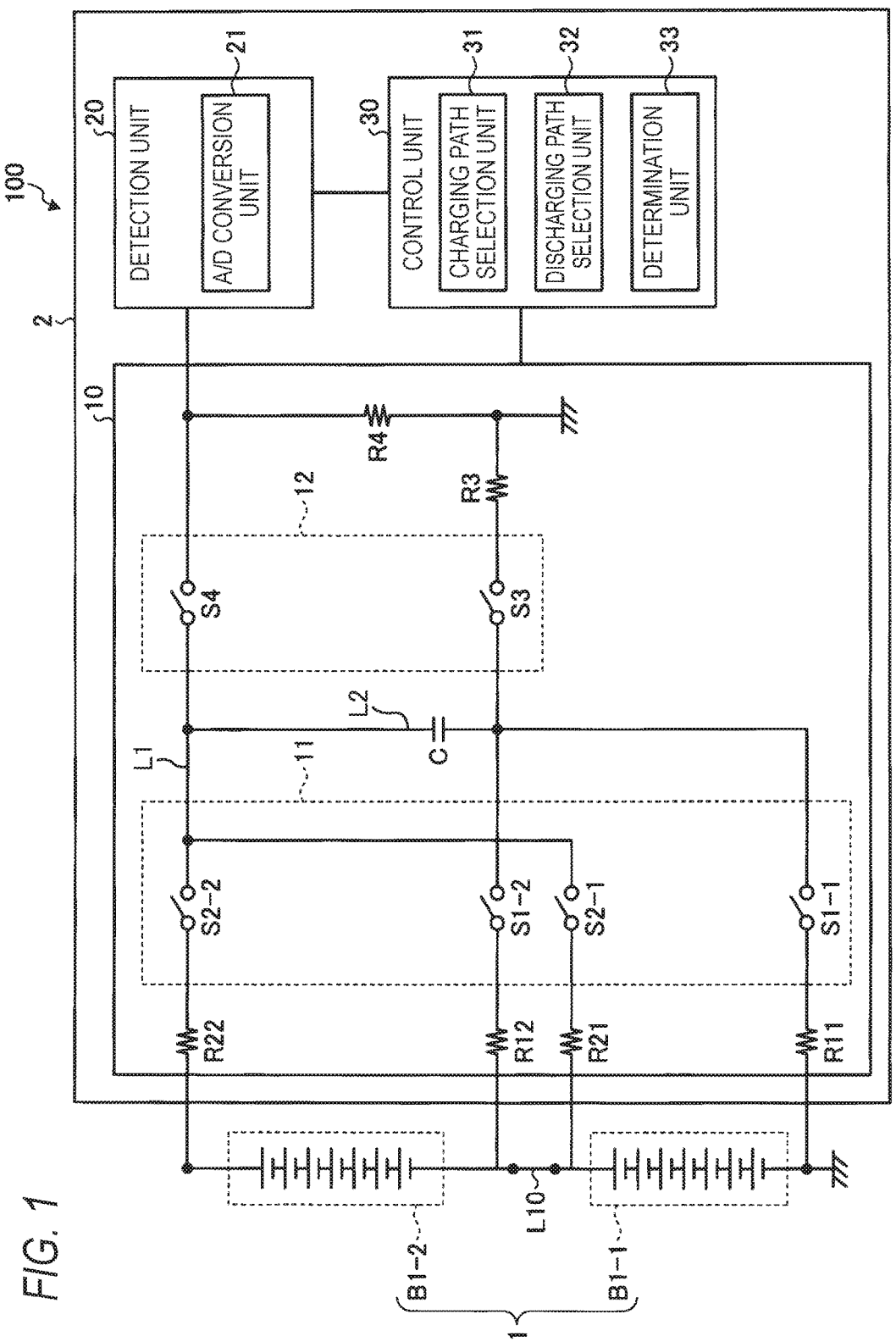
FIG. 1 depicts a configuration of a battery pack system according to an illustrative embodiment.

FIG. 1 depicts a configuration example of a battery pack system 100 according to a first illustrative embodiment. The battery pack system 100 shown in FIG. 1 has a battery pack 1, and a monitoring device 2 configured to operate as a voltage detection device configured to detect a voltage of the battery pack 1.

The battery pack 1 has a plurality of battery stacks B1-$n$ ($n=1$ to N, N: natural number; hereinafter, also referred to as the battery stack B1) connected in series via a connection member L10-$m$ ($m=1$ to N−1, N: natural number; hereinafter, also referred to as the connection member L10). The plurality of battery stacks B1-$n$ has a plurality of battery cells connected in series, respectively. In the example of FIG. 1, the two battery stacks B1-1, B1-2 each of which has the seven battery cells connected in series are connected in series via the connection member L10.

The monitoring device 2 is a device configured to detect a voltage of the battery stack B1 in a so-called flying capacitor manner by using a capacitor C, and has a flying capacitor unit 10, a detection unit 20 and a control unit 30. In this way, the monitoring device 2 is also configured to operate as a voltage detection device configured to detect the voltage of the battery stack B1.

The flying capacitor unit 10 has a capacitor C, a first switching unit 11 provided between the capacitor and the battery stack B1, and a second switching unit 12 provided between the capacitor C and the detection unit 20.

Also, the flying capacitor unit 10 has a connection line L1 configured to connect the first switching unit 11 and the second switching unit 12. Also, the flying capacitor unit 10 has a branch line L2, which is branched from the connection line L1 and connected to the capacitor C and in which current flows in a charging direction upon charging of the capacitor C and current flows in a discharging direction opposite to the charging direction upon discharging of the capacitor C. The branch line L2 is a single line.

Also, the flying capacitor unit 10 has resistances R11, R12, R21, R22 connected in series to the first switching unit 11 between the battery stack B1 and the capacitor C, and resistances R3, R4 provided between the second switching unit 12 and the detection unit 20. In the meantime, positions of the resistances R3, R4 on the lines shown in FIG. 1 are exemplary, and the resistances R3, R4 may be provided on the other positions inasmuch as the resistances R3, R4 are provided on a rear end line of the second switching unit 12. Also, the number of resistances to be provided may be changed.

The first switching unit 11 has a plurality of first switches S1-1, S1-2 (hereinafter, also referred to as the first switch S1), each of which has one end connected to a negative terminal of the battery stack B1 and the other end connected to one end of the capacitor C, and a plurality of second switches S2-1, S2-2 (hereinafter, also referred to as the second switch S2), each of which has one end connected to a positive terminal of the battery stack B1 and the other end connected to the other end of the capacitor C. The first switching unit 11 is configured to switch on and off states of the first switch S1 and the second switch S2, in response to an instruction from the control unit 30. In this way, the first switching unit 11 is configured as a first switching unit configured to switch a connection state between the battery stack B1 and the capacitor C.

The second switching unit 12 has a third switch S3 having one end connected to the one end of the capacitor C and the other end connected to the detection unit 20 and a fourth switch S4 having one end connected to the one end of the capacitor C and the other end connected to the detection unit 20. The second switching unit 12 is configured to switch on and off states of the third and fourth switches S3, S4, in response to an instruction from the control unit 30. In this way, the second switching unit 12 is configured as a second switching unit configured to switch a connection state between the capacitor C and the detection unit 20. In the meantime, relays may be used as the first to fourth switches S1 to S4, for example.

The capacitor C is connected in parallel with one of the battery stacks B1-1, B1-2 via the first switching unit 11 at a state where it is isolated from the detection unit 20 by the second switching unit 12. Thereby, the capacitor C is charged by the battery stack B1 connected in parallel with the capacitor. Also, the capacitor C is connected to the detection unit 20 via the second switching unit 12 at a state where it is isolated from the battery stack B1 by the first switching unit 11. Thereby, the detection unit 20 is configured to detect a voltage between both ends of the capacitor C as the voltage of the battery stack B1. In this way, the monitoring device 2 is configured to detect the voltage of the battery stack B1 by the flying capacitor method of using the capacitor C. In the meantime, a differential amplifier circuit may be provided between the second switching unit 12 and the detection unit 20, and the detection unit 20 may be configured to detect a voltage of the capacitor C on the basis of an output of the differential amplifier circuit.

Also, the capacitor C is connected to the connection member L10 via the first switching unit 11 at the state where it is isolated from the detection unit 20 by the second switching unit 12. Alternatively, the capacitor C is connected to the resistances R3, R4 via the second switching unit 12 at the state where it is isolated from the battery stack B1 by the first switching unit 11. Thereby, the current flows through a discharging path (refer to a first discharging path P2 of FIG. 3 and a second discharging path P3 of FIG. 4), and the capacitor C is discharged.

The resistances R11, R12 are connected in series to the first switch S1 between the first switch S1 and the battery stacks B1-1, B1-2. Also, the resistances R21, R22 are connected in series to the second switch S2 between the second switch S2 and the battery stacks B1-1, B1-2. The resistances R11, R12, R21, R22 are configured to operate as a current limiting resistance configured to limit the current flowing from the battery stack B1 to the flying capacitor unit 10.

Also, the resistances R11, R12, R21, R22 are connected to the capacitor C via the first switching unit 11 and are thus configured to operate as a charging resistance configured to charge charges in the capacitor C and a discharging resistance configured to discharge charges of the capacitor C. In the meantime, in order to shorten a voltage detection time period of the battery stack, it is preferably to shorten a charging time period, i.e., to reduce a charging time constant. Therefore, the resistances R11, R12, R21, R22 are made to have relatively small resistance values. Therefore, even when the discharging is performed on the discharging path (the first discharging path P2 of FIG. 3) including the resistances R11, R12, R21, R22, a discharging time constant is decreased and a discharging time period is also shortened.

Meanwhile, in FIG. 1, the resistances R11, R12, R21, R22 are provided between the battery stack B1 and the first switching unit 11. However, for example, the resistances R11, R12, R21, R22 may be provided between the first switching unit 11 and the capacitor C.

The resistance R3 has one end connected to the third switch S3 and the other end connected to the detection unit 20 and earthed to the ground. The resistance R4 has one end connected to the fourth switch S4 and the other end connected to the detection unit 20 and earthed to the ground. The resistances R3, R4 are a discharging circuit configured to operate as a current limiting resistance configured to limit current flowing from the capacitor C to the detection unit 20 and as a discharging resistance connected to the capacitor C via the second switching unit 12 and configured to discharge charges of the capacitor C.

The detection unit 20 is configured to detect a voltage between both ends of the capacitor C. Specifically, the detection unit 20 has an A/D conversion unit 21, and is configured to convert a voltage between both ends of the capacitor C from an analog value to a digital value by using the A/D conversion unit 21 and to output the same to the control unit 30. The detection unit 20 is configured to detect a voltage (hereinafter, referred to as a charging voltage) of the capacitor C after the charging, as a voltage of the battery stack B1, in response to an instruction from the control unit 30. Also, the detection unit 20 is configured to detect a voltage (hereinafter, referred to as a discharging voltage) of the capacitor C after the discharging, in response to an instruction from the control unit 30.

Meanwhile, in order to detect the voltage between both ends of the capacitor C at the detection unit 20, it is necessary to turn on the third and fourth switches S3, S4. A discharging path (a second discharging path P3 of FIG. 4) having the resistances R3, R4 interposed thereon is formed and the discharging starts from the moment that both the switches S3, S4 become on. Therefore, in order to correctly detect the voltage of the battery stack B1, it is preferably to perform the AD conversion for the voltage between both ends of the capacitor C at the moment that both the switches S3, S4 become on and to increase the discharging time constant for removing the lowering due to the discharging as much as possible. For this reason, the resistances R3, R4 are made to have relatively great resistance values, as compared to the resistances R11 to R22.

The control unit 30 is configured to control the first switching unit 11 and the second switching unit 12. The control unit 30 has a charging path selection unit 31, a discharging path selection unit 32 and a determination unit 33. When charging the capacitor C, the charging path selection unit 31 selects a charging path P1 including the battery stack B1 of which a voltage is to be detected and the capacitor C. When discharging the capacitor C, the discharging path selection unit 32 selects a first discharging path P2 including the capacitor C and the connection member L10 or a second discharging path P3 including the resistances R3, R4. Also, when detecting the voltage between both ends of the capacitor C, the discharging path selection unit 32 selects the second discharging path P3 including the resistances R3, R4. The charging path P1 and the first and second discharging paths P2, P3 will be described in detail later.

The determination unit 33 is configured to determine whether an abnormality has occurred in the battery pack 1 and the first and second switches S1, S2 in correspondence to at least one of the charging voltage and the discharging voltage of the capacitor C. The abnormality determination by the determination unit 33 will be described in detail later.

The control unit 30 is configured to control the first switching unit 11 and the second switching unit 12 so that the charging path P1 is selected upon the charging of the capacitor C. The control unit 30 is configured to control the detection unit 20 so as to detect the charging voltage or discharging voltage of the capacitor C and to control the first switching unit 11 and the second switching unit 12 so as to select the second discharging path P3 and to connect the capacitor C and the detection unit 20. Also, the control unit 30 selects the first discharging path P2 or the second discharging path P3 when performing the discharging after detecting the voltage of the capacitor C. Also, the control unit 30 is configured to monitor a charging status of the battery stack B1, based on the voltage of the battery stack B1 detected by the detection unit 20.

A2. Selection of Charging Path P1

Figure 2:
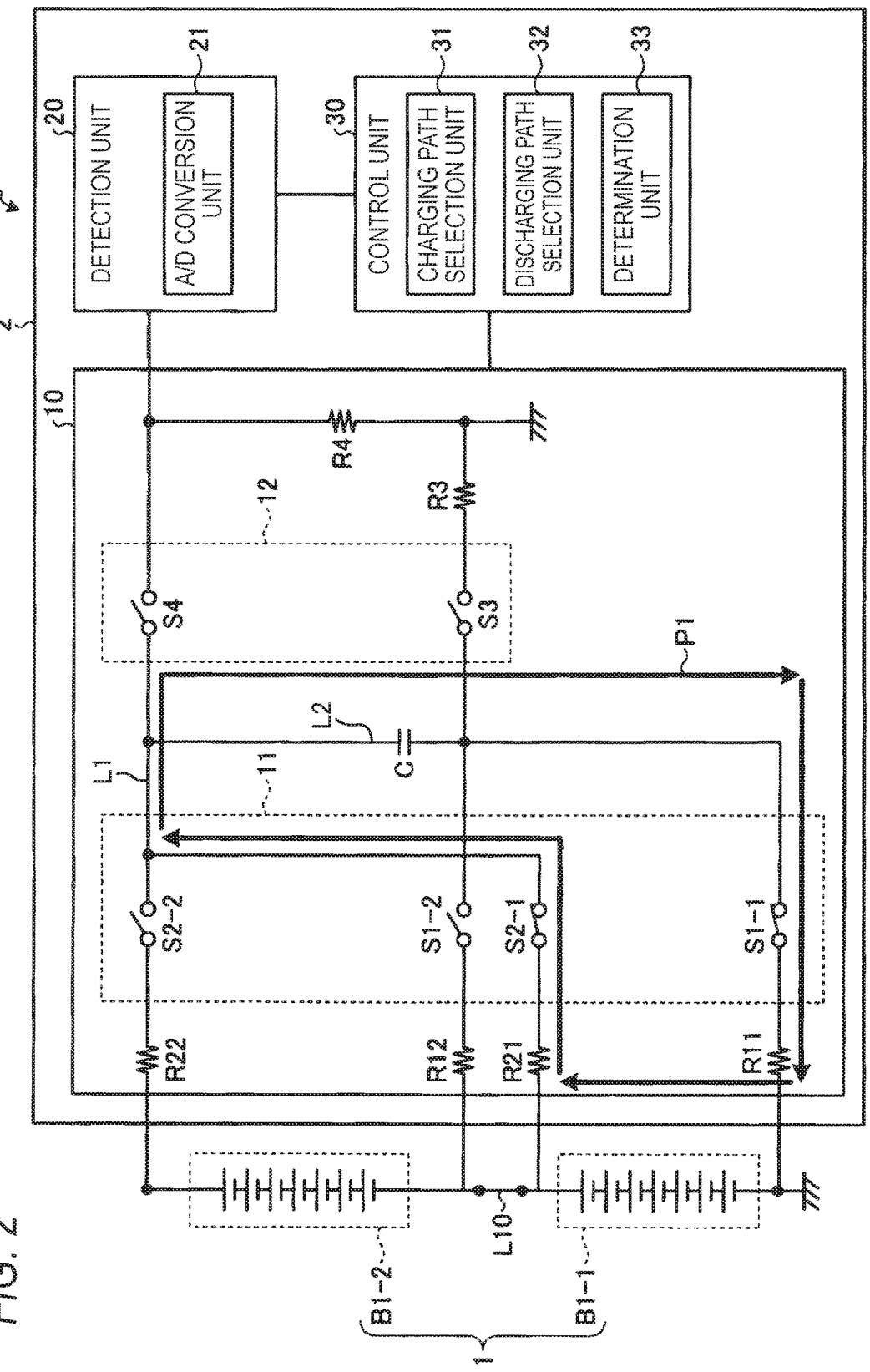
FIG. 2 depicts an example of a charging path that is to be selected by a charging path selection unit.

Subsequently, the charging path P1 that is to be selected by the charging path selection unit 31 of the control unit 30 is described in detail with reference to FIG. 2. FIG. 2 depicts an example of the charging path P1 that is to be selected by the charging path selection unit 31. Meanwhile, FIG. 2 depicts an example where a voltage of the battery stack B1-1 is detected.

First, when the charging path selection unit 31 receives an instruction to select the charging path P1 of the battery stack B1-1 from the control unit 30, the charging path selection unit 31 selects the charging path P1 on which the battery stack B1-1 and the capacitor C are connected in parallel.

Specifically, as shown in FIG. 2, the charging path selection unit 31 selects the charging path P1 including the battery stack B1-1, the resistances R11, R21, the first switch S1-1, the second switch S2-1 and the capacitor C.

That is, the control unit 30 controls the first and second switching units 11, 12 so that a closed circuit of the charging path P1 is formed in the flying capacitor unit 10. Specifically, the control unit 30 performs the control so that the first and second switches S1-1, S2-1 to be connected to the battery stack B1-1 become on and the other switches S1-2, S2-2, S3, S4 become off.

Thereby, the current flows in the flying capacitor unit 10 in a direction shown with the arrows in FIG. 2, so that the capacitor C is charged over a relatively short time period because the charging time constant is small, as described above.

In the meantime, the example where the battery stack B1-1, which is a detection target of the voltage, is determined by the control unit 30 is here described. However, the battery stack B1, which is a detection target of the voltage, may be determined by the charging path selection unit 31.

In the meantime, when the battery stack B1-2, which is a detection target of the voltage, is determined by the control unit 30, the control unit 30 performs the control so that the first and second switches S1-1, S2-2 to be connected to the battery stack B1-2 become on and the other switches S1-2, S2-1, S3, S4 become off.

A3. Selection of Discharging Path

<A3-1. Selection of First Discharging Path P2>

Figure 3:
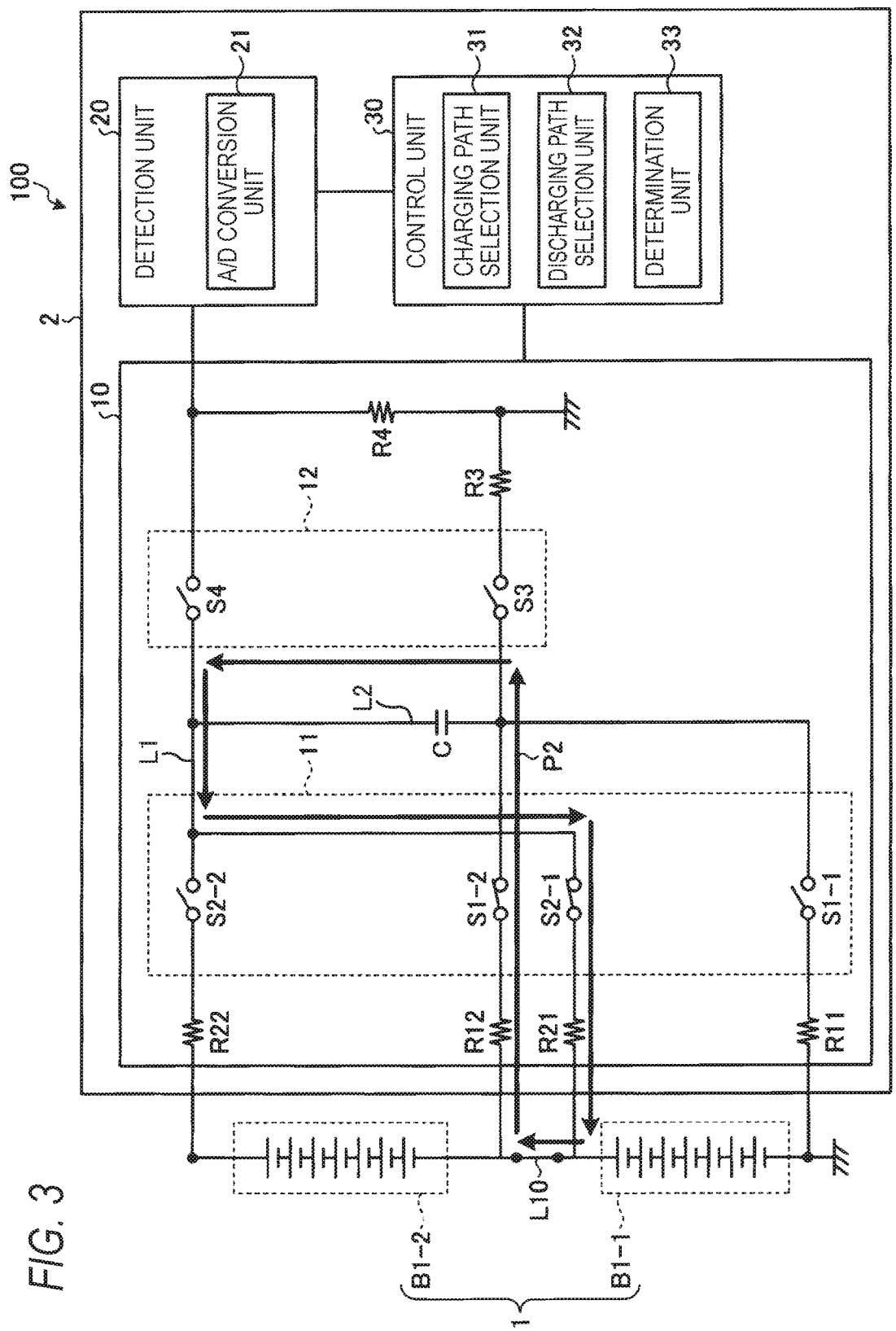
FIG. 3 depicts an example of a first discharging path that is to be selected by a discharging path selection unit.

Subsequently, the first discharging path P2 that is to be selected by the discharging path selection unit 32 of the control unit 30 is described in detail with reference to FIG. 3. FIG. 3 depicts an example of the first discharging path P2 that is to be selected by the discharging path selection unit 32.

When the detection unit 20 detects a voltage of the battery stack B1 by the second discharging path P3, the control unit 30 instructs the discharging path selection unit 32 to switch the discharging path to the first discharging path P2. When the discharging path selection unit 32 receives the instruction from the control unit 30, the discharging path selection unit 32 selects the first discharging path P2 on which the connection member L10 and the capacitor C are connected. Specifically, the discharging path selection unit 32 selects the first discharging path P2 including the connection member L10, the resistances R12, R21, the first switch S1-2, the second switch S2-1 and the capacitor C.

That is, the control unit 30 controls the first and second switching units 11, 12 so that a closed circuit of the first discharging path P2 is formed in the flying capacitor unit 10. Specifically, the control unit 30 performs the control so that the first switch S1-2 and the second switch S2-1 become on and the first switch S1-1, the second switch S2-2, and the third and fourth switches S3, S4 become off.

Thereby, the current flows in the flying capacitor unit 10 in a direction shown with the arrows in FIG. 3, so that the capacitor C is discharged over a relatively short time period because the discharging time constant is small, as described above.

<A3-2. Selection of Second Discharging Path P3>

Figure 4:
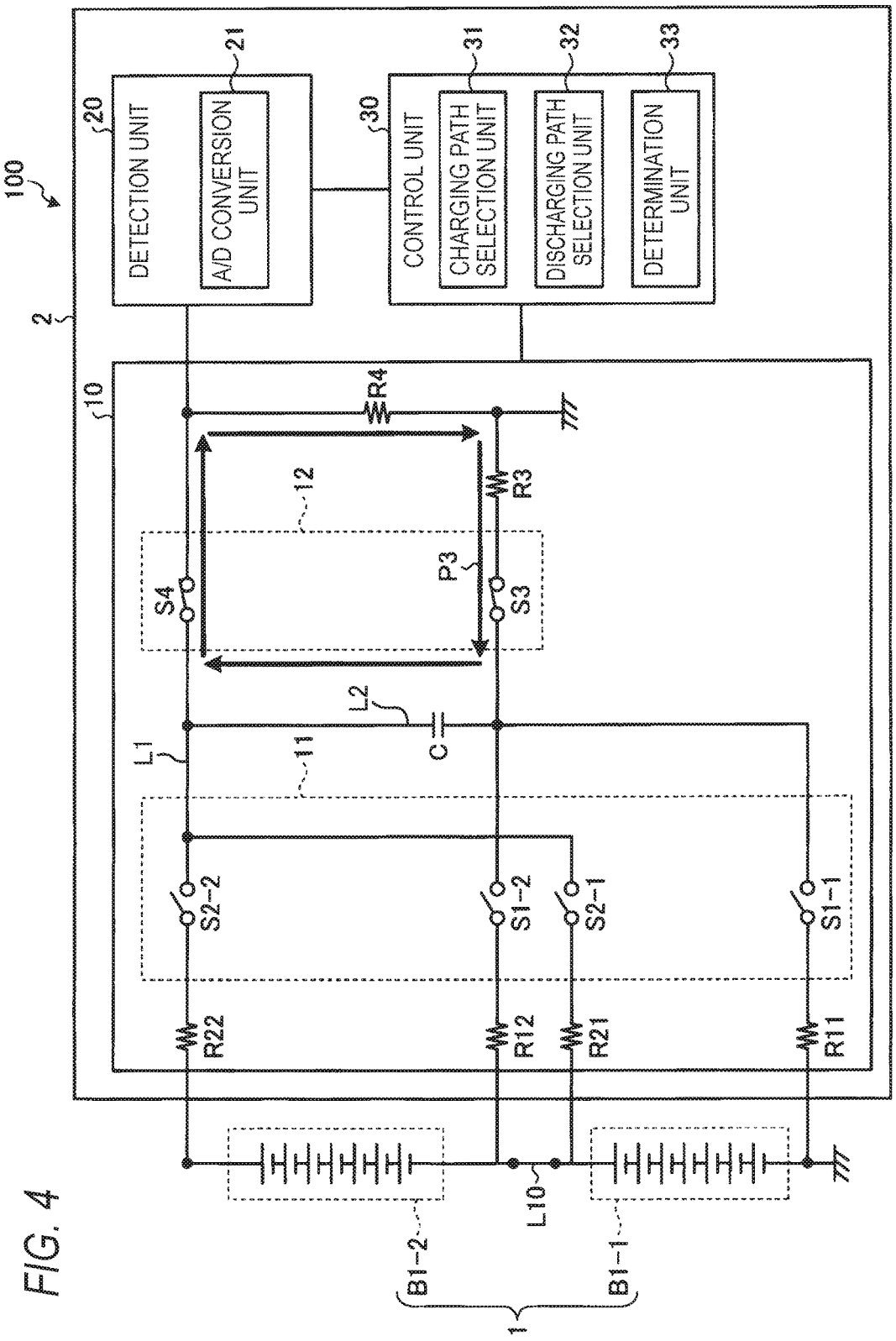
FIG. 4 depicts an example of a second discharging path that is to be selected by the discharging path selection unit.

Subsequently, the second discharging path P3 that is to be selected by the discharging path selection unit 32 of the control unit 30 is described in detail with reference to FIG. 4. FIG. 4 depicts an example of the second discharging path P3 that is to be selected by the discharging path selection unit 32.

When the detection unit 20 detects a voltage of the battery stack B1 or the capacitor C cannot be discharged through the first discharging path P2, as described later, the control unit 30 instructs the discharging path selection unit 32 to select the second discharging path P3. When the discharging path selection unit 32 receives the instruction from the control unit 30, the discharging path selection unit 32 selects the second discharging path P2 on which the resistances R3, R4 (the discharging circuit) and the capacitor C are connected each other. Specifically, the discharging path selection unit 32 selects the second discharging path P3 including the resistances R3, R4, the third and fourth switches S3, S4 and the capacitor C.

That is, the control unit 30 controls the first and second switching units 11, 12 so that a closed circuit of the second discharging path P3 is formed in the flying capacitor unit 10. Specifically, the control unit 30 performs the control so that the first and second switches S1, S2 become off and the third and fourth switches S3, S4 become on. Thereby, the current flows in the flying capacitor unit 10 in a direction shown with the arrows in FIG. 4, so that the capacitor C is discharged over a relatively long time period because the discharging time constant is large, as described above.

Here, when discharging the capacitor C, the direction of the current through the branch line L2 is hereinafter referred to as 'discharging direction.' The discharging direction is opposite to the charging direction. In this way, the current flowing in the charging direction and the current flowing in the discharging direction flow through the branch line L2, which is a single line. In this way, a part of the charging path and a part of the discharging path are formed by the one line.

In the first illustrative embodiment, the charging path selection unit 31 and the discharging path selection unit 32 are configured to select the charging path P1, the discharging path P2 and the discharging path P3 each including the branch line L2, respectively. Thereby, it is not necessary to separately provide a charging line for accumulating the charges in the capacitor C upon the charging and a discharging line for discharging the charges upon the voltage detection, as the lines to be connected to the capacitor C. Therefore, for example, it is not necessary to provide a circuit element such as a diode configured to limit the direction of the current flowing through a charging line and a discharging line, so that it is possible to suppress the increase in the number of components of the monitoring device 2.

As described above, the discharging path selection unit 32 selects the discharging path P2, so that when the detection unit 20 detects, as the voltage of the battery stack B1, the voltage between both ends of the capacitor C, after charging the capacitor C through the charging path P1, the detection unit 20 can correctly measure the voltage of the battery stack B1. In the below, the reason that the voltage of the battery stack B1, i.e. the voltage of the capacitor C can be correctly measured is described.

In order to correctly measure the voltage of the battery stack B1, it is necessary to AD-convert and measure the voltage of the capacitor C at the moment that the discharging path is formed by turning on the switches S3, S4. When the time constant of the discharging path is small, a lowering degree of the voltage of the capacitor C increases upon the AD conversion, so that it is not possible to correctly measure the stack voltage. In contrast, when the resistance values of the resistances R3, R4 are relatively large, i.e., the discharging time constant is great, like the discharging path P2 of the first illustrative embodiment, a lowering degree of the voltage of the capacitor C decreases upon the AD conversion at the A/D conversion unit 21, so that it is possible to correctly detect the voltage of the capacitor C just after the discharging starts.

Also, after the second discharging path P3 is selected and the voltage between both ends of the capacitor C is thus detected at the detection unit 20, the second discharging path P3 is switched to the first discharging path P2 and the discharging is performed. Thereby, it is possible to perform the discharging in a short time period. The reason is that the resistance values of the resistances R12, R21 included on the first discharging path P2 are set to be less than the resistance values of the resistances R3, R4 included on the second discharging path P3, i.e., the discharging time constant of the first discharging path P2 is smaller than the discharging time constant of the second discharging path P3.

Also, the second discharging path P3 is a path that is also to be selected when the control unit 30 determines that an abnormality has occurred in the connection member L10 or the first and second switches S1, S2 included on the first discharging path P2 and the capacitor C cannot be thus discharged. An example where the control unit 30 selects the second discharging path P3 when an abnormality occurs will be described in detail later.

<A4. Abnormality Determination by Determination Unit 33>

The abnormality determination for the battery pack 1 and the first and second switches S1, S2, which is to be performed by the determination unit 33 of the control unit 30, is described in detail.

The abnormality to occur in the battery pack 1 includes an open abnormality that an open state is formed between the battery stacks B1-1, B1-2 due to the disconnection of the connection member L10 or when the connection member L10 is not arranged upon assembling of the battery pack 1, for example.

Also, the abnormality to occur in the first and second switches S1, S2 includes an open abnormality that a switch is kept at an off state without shifting to an on state or a short abnormality that a switch is kept at an on state without shifting to an off state.

A relation between the abnormalities and the charging voltage and discharging voltage of the capacitor C is described with respect to the abnormality determination by the determination unit 33 with reference to the drawings. For simple descriptions, a transient response of the capacitor C is not considered and the configurations unnecessary for the descriptions are not shown. Also, the voltage of the battery stack B1 is denoted as V1.

<4-1. When Connection Member L10 and First and Second Switches S1, S2 are Normal>

Figure 5:
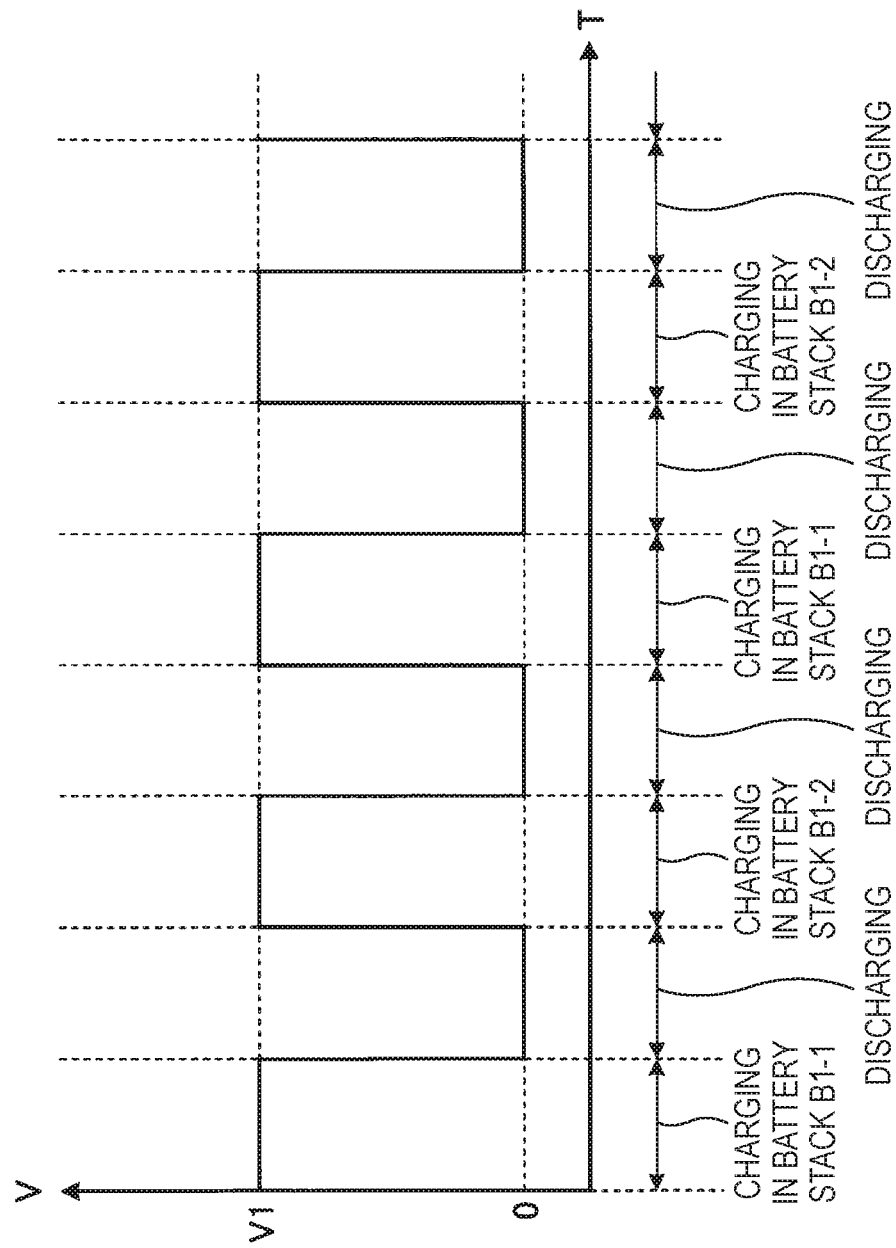
FIG. 5 depicts a voltage of a capacitor when a connection member and first and second switches are normal.

An example where the connection member L10 and the first and second switch S1, S2 normally operate without any abnormality is described with reference to FIG. 5. FIG. 5 depicts a voltage of the capacitor C when the connection member L10 and the first and second switches S1, S2 are normal.

First, the control unit 30 detects a voltage of the battery stack B1-1. The control unit 30 selects the charging path P1 including the battery stack B1-1 of which a voltage is to be detected and the capacitor C. Thereby, the capacitor C is charged by the battery stack B1-1, and the voltage of the capacitor C becomes the same voltage V1 as the voltage of the battery stack B1-1.

When the path is switched to the second discharging path P3 and the voltage of the battery stack B1-1 is detected, the control unit 30 selects the first discharging path P2 including the capacitor C and the connection member L10 and discharges the capacitor C. Thereby, the voltage of the capacitor C becomes zero.

Then, the control unit 30 selects a charging path P1a including the battery stack B1-2 and the capacitor C, and detects a voltage of the battery stack B1-2. Thereby, the capacitor C is charged by the battery stack B1-2, and the voltage of the capacitor C becomes the same voltage V1 as the voltage of the battery stack B1-2. Here, when selecting the charging path P1a (not shown), specifically, the control unit 30 performs the control so that the first and second switches S1-2, S2-2 to be connected to the battery stack B1-2 become on and the other switches S1-1, S2-1, S3, S4 become off.

When the path is switched to the second discharging path P3 and the voltage of the battery stack B1-2 is detected, the control unit 30 selects the first discharging path P2 including the capacitor C and the connection member L10 and discharges the capacitor C. Thereby, the voltage of the capacitor C becomes zero.

In this way, when the monitoring device 2 repeatedly detects the voltages in order of the battery stack B1-1 and the battery stack B1-2, the voltage of the capacitor C forms a voltage waveform repeating between the voltage V1 and zero at a predetermined interval, as shown in FIG. 5.

<A4-2. When Open Abnormality has Occurred in First Switch S1-1>

Figure 6:
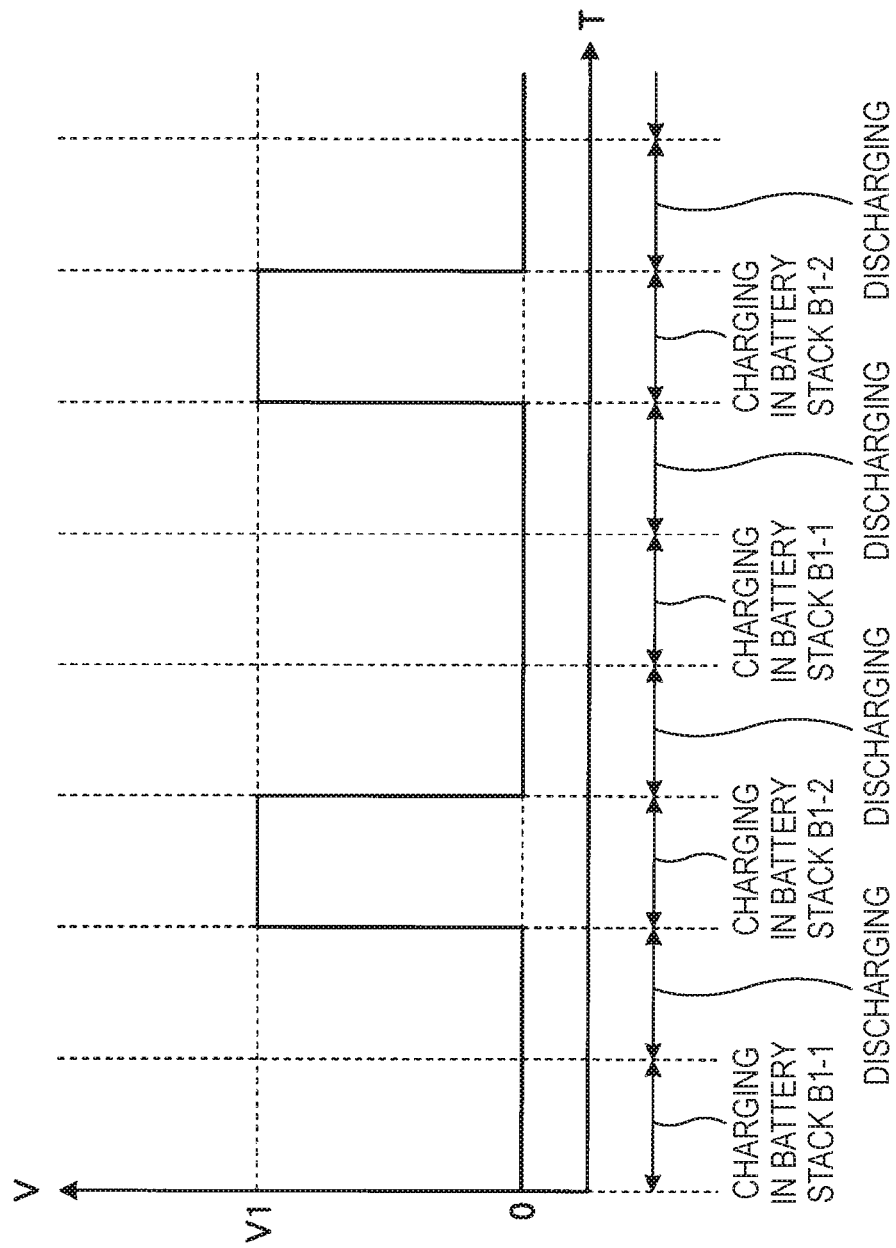
FIG. 6 depicts a voltage of the capacitor when an open abnormality has occurred in the first switch.

An example where an open abnormality has occurred in the first switch S1-1 is described with reference to FIG. 6. FIG. 6 depicts a voltage of the capacitor C when an open abnormality has occurred in the first switch S1-1.

First, the control unit 30 selects the charging path P1 including the battery stack B1-1 and the capacitor C so as to detect a voltage of the battery stack B1-1 (refer to FIG. 2). Since an open abnormality has occurred in the first switch S1-1 to be connected to the battery stack B1-1, the first switch S1-1 does not shift to an on state and the closed circuit of the charging path P1 is not formed in the flying capacitor unit 10. Therefore, the capacitor C is not charged by the battery stack B1-1 and is kept at the original voltage. For example, when the capacitor C is discharged and the voltage thereof is thus zero, the voltage of the capacitor C is still kept at the zero voltage even though the control unit 30 selects the charging path P1 including the battery stack B1-1.

On the other hand, an abnormality has not occurred in the connection member L10 and the first and second switches S1-2, S2-1, S2-2 included on the first discharging path P2 and the charging path P1a including the battery stack B1-2. For this reason, the discharging of the capacitor C and the charging thereof by the battery stack B1-2 are performed without any problem.

Therefore, in this case, the voltage of the capacitor C becomes zero upon the charging by the battery stack B1-1 and upon the discharging and becomes V1 upon the charging by the battery stack B1-2, as shown in FIG. 6.

<A4-3. When Open Abnormality has Occurred in Second Switch S2-2>

Figure 7:
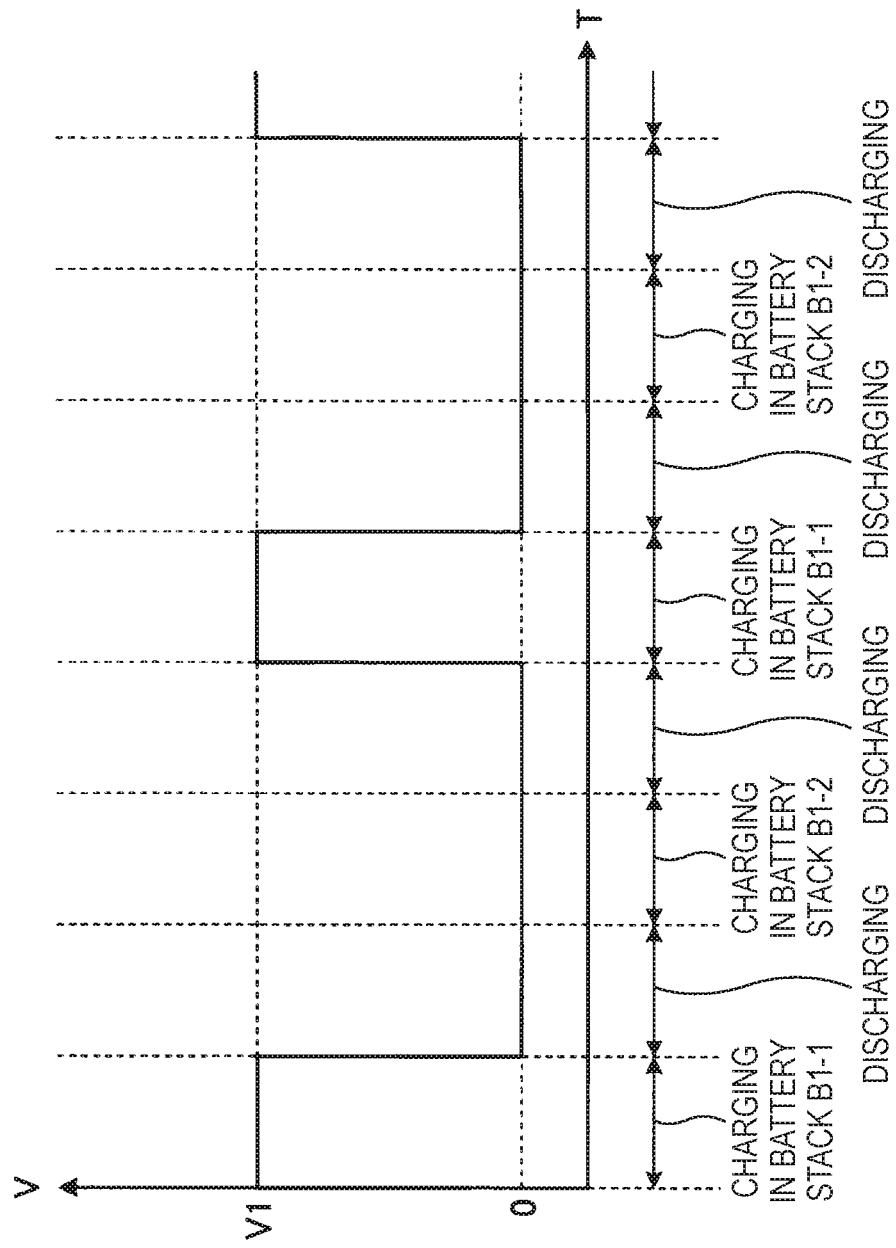
FIG. 7 depicts a voltage of the capacitor when the open abnormality has occurred in the second switch.

FIG. 7 depicts a voltage of the capacitor C when an open abnormality has occurred in the second switch S2-2.

An abnormality has not occurred in the connection member L10 and the first and second switches S1-1, S1-2, S2-1 included on the first discharging path P2 and the charging path P1 including the battery stack B1-1. For this reason, the discharging of the capacitor C and the charging thereof by the battery stack B1-1 are performed without any problem.

In the meantime, when detecting a voltage of the battery stack B1-2, the closed circuit of the charging path P1a including the battery stack B1-2 is not formed in the flying capacitor unit 10 because the open abnormality has occurred in the second switch S2-2 to be connected to the battery stack B1-2. Therefore, the capacitor C is not charged by the battery stack B1-2 and keeps the discharging voltage.

Therefore, in this case, the voltage of the capacitor C becomes zero upon the charging by the battery stack B1-2 and upon the discharging and becomes V1 upon the charging by the battery stack B1-1, as shown in FIG. 7.

<A4-4. Open Abnormality Determination 1 By Determination Unit 33>

In this way, when the open abnormality occurs in the switch, which is included on the charging path P1 and is not included on the first discharging path P2, the capacitor C is discharged through the first discharging path P2 but is not charged through the charging path P1.

Therefore, for example, when the charging through the charging path P1 including the battery stack B1-1 is not performed and the charging through the charging path P1a including the battery stack B1-2 and the discharging through the first discharging path P2 are performed, the determination unit 33 detects the charging voltage and the discharging voltage and determines that the open abnormality has occurred in the first switch S1-1, which is included on the charging path P1 including the battery stack B1-1 and is not included on the first discharging path P2. Specifically, the determination unit 33 compares the charging voltage and a predetermined threshold Vth. When the charging voltage is equal to or less than the predetermined threshold Vth, the determination unit 33 determines that the charging is not performed and determines that the open abnormality has occurred in the first switch S1-1, which is not included on the first discharging path P2, of the first and second switches S1-1, S2-1 to be connected to the battery stack B1-1 included on the charging path P1. Also, when the charging through the charging path P1a including the battery stack B1-2 is not performed, the determination unit 33 also determines that the open abnormality has occurred in the second switch S2-2.

On the other hand, the determination unit 33 compares the discharging voltage and the predetermined threshold Vth, and determines that the discharging is not performed when the discharging voltage is equal to or less than the predetermined threshold Vth. The predetermined threshold Vth is a threshold that is to be determined depending on a transient response of the capacitor C, for example, and is not necessarily required to be zero. Meanwhile, in the above descriptions and the below descriptions, when detecting the charging voltage and the discharging voltage, the second discharging path P3 is selected for a moment upon the ending of each charging time period or discharging time period, so that the charging voltage or the discharging voltage is read out.

<A4-5. When Open Abnormality has Occurred in Second Switch S2-1>

First, when detecting a voltage of the battery stack B1-1, since the open abnormality has occurred in the second switch S2-1 to be connected to the battery stack B1-1, the closed circuit of the charging path P1 including the battery stack B1-1 is not formed in the flying capacitor unit 10. Therefore, the capacitor C is not charged by the battery stack B1-1 and keeps the discharging voltage.

Also, the second switch S2-1 is included on the first discharging path P2, too (refer to FIG. 3). Therefore, since the closed circuit of the first discharging path P2 is not formed in the flying capacitor unit 10, the capacitor C is not discharged and keeps the charging voltage.

On the other hand, an abnormality has not occurred in the first and second switches S1-2, S2-2 included on the charging path P1a including the battery stack B1-2. For this reason, the capacitor C is charged by the battery stack B1-2.

Therefore, in this case, the voltage of the capacitor C is zero until the capacitor C is charged by the battery stack B1-2. Also, when the capacitor C is charged by the battery stack B1-2, the capacitor C is somewhat discharged due to an influence of a parasitic resistance and the like included in the flying capacitor unit 10 but keeps the charging voltage by the battery stack B1-2.

<A4-6. When Open Abnormality has Occurred in First Switch S1-2>

When detecting the voltage of the battery stack B1-1, an abnormality has not occurred in the first and second switches S1-1, S2-1 included on the charging path P1 including the battery stack B1-1. For this reason, the capacitor C is charged by the battery stack B1-1.

On the other hand, when detecting the voltage of the battery stack B1-2, since the open abnormality has occurred in the first switch S1-2 to be connected to the battery stack B1-2, the closed circuit of the charging path P1a including the battery stack B1-2 is not formed in the flying capacitor unit 10. Therefore, the capacitor C is not charged by the battery stack B1-2 and keeps the discharging voltage.

Also, the first switch S1-2 is included on the first discharging path P2, too (refer to FIG. 3). Therefore, since the closed circuit of the first discharging path P2 is not formed in the flying capacitor unit 10, the capacitor C is not discharged and keeps the charging voltage.

Therefore, in this case, when the capacitor C is charged by the battery stack B1-1, the capacitor C is somewhat discharged due to the influence of the parasitic resistance and the like included in the flying capacitor unit 10 but keeps the charging voltage by the battery stack B1-1.

<A4-7. When Open Abnormality has Occurred in Connection Member L10>

When detecting the voltage of the battery stack B1, an abnormality has not occurred in the first and second switches S1, S2 included on the charging path P1 including the battery stack B1. For this reason, the capacitor C is charged by the battery stack B1.

In the meantime, the connection member L10 is included on the first discharging path P2 (refer to FIG. 3). Therefore, since the closed circuit of the first discharging path P2 is not formed in the flying capacitor unit 10, the capacitor C is not discharged and keeps the charging voltage.

Therefore, in this case, when the capacitor C is charged by the battery stack B1, the capacitor C is somewhat discharged due to the influence of the parasitic resistance and the like included in the flying capacitor unit 10 but keeps the charging voltage by the battery stack B1.

<A4-8. Open Abnormality Determination 2 By Determination Unit 33>

As described above, when the open abnormality has occurred in any one of the connection member L10, the first switch S1-2 and the second switch S2-1 included on the first discharging path P2, the capacitor C is not discharged. Therefore, in any case, the capacitor C is somewhat discharged due to the influence of the parasitic resistance and the like included in the flying capacitor unit 10 but keeps the voltage V1, which is substantially the same as the voltage of the battery stack B1, so that it is difficult to specify an abnormality place.

For this reason, when it is determined that the abnormality has occurred in the battery pack 1 and the first and second switches S1, S2, in correspondence to at least one of the charging voltage through the charging path P1 and the discharging voltage through the first discharging path P2, an abnormality place may be erroneously determined. Therefore, when the capacitor C is not discharged through the first discharging path P2, i.e., when it is determined that the open abnormality has occurred in any one of the connection member L10 and the first and second switches S1, S2, the determination unit 33 of the first illustrative embodiment continuously specifies an abnormality place in correspondence to at least one of the charging voltage through the charging path P1 and the discharging voltage through the second discharging path P3.

Specifically, when the discharging voltage of the capacitor C is within a defined range, the control unit 30 of the first illustrative embodiment determines that the capacitor C is not discharged, and instructs the discharging path selection unit 32 to select the second discharging path P3. In this way, the control unit 30 is configured to select the second discharging path P3 different from the first discharging path P2, so that it is possible to discharge the capacitor C. In the meantime, the defined range is a predetermined range including the voltage V1 of the battery stack B1, and is here V1±ΔV.

Also, the control unit 30 is configured to instruct the charging path selection unit 31 to select the charging path P1 including the one battery stack B1-1 to be connected via the connection member L10 included on the first discharging path P2 and the charging path P1a including the other battery stack B1-2. Thereby, the control unit 30 specifies an abnormality place.

Figure 8:
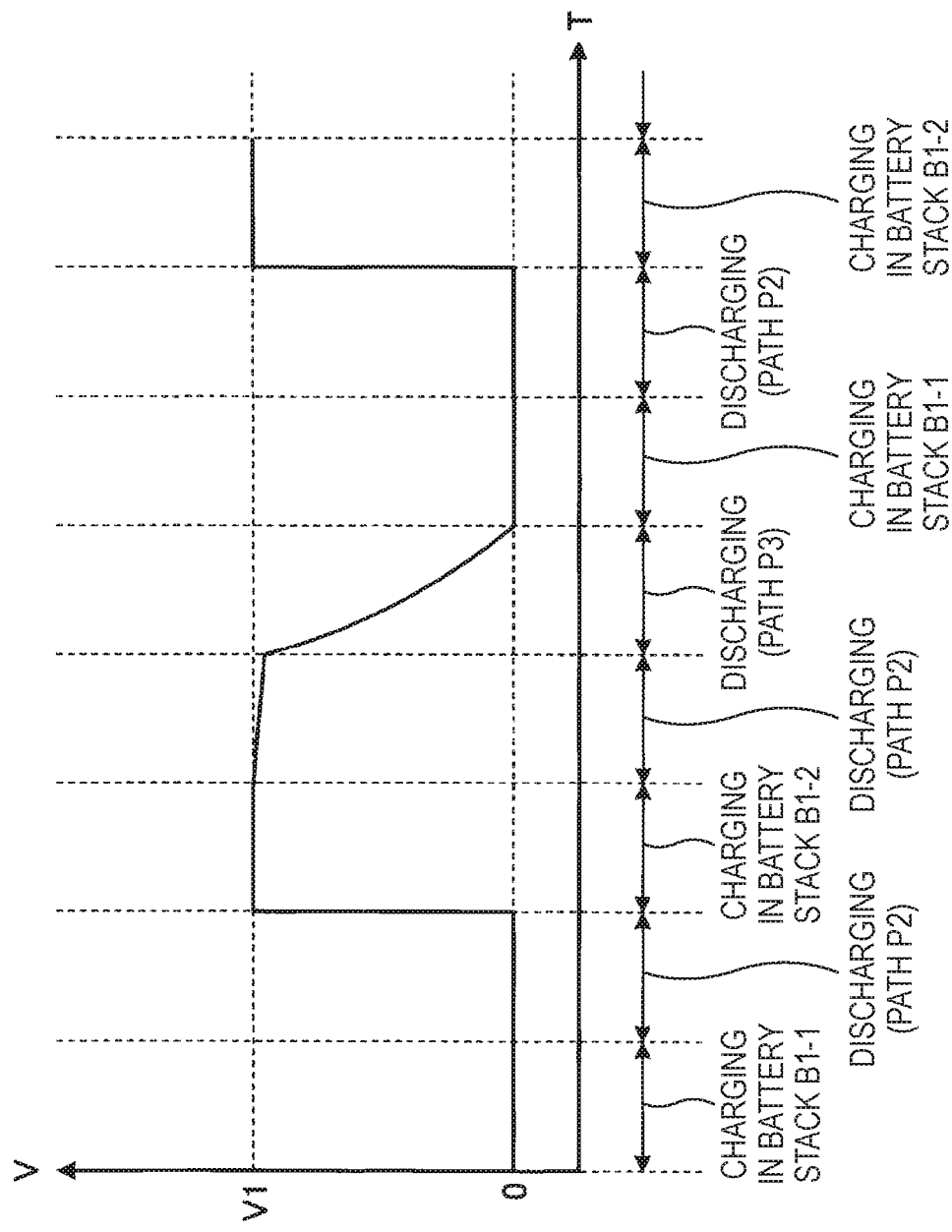
FIG. 8 depicts a voltage of the capacitor when the open abnormality has occurred in the second switch.

In the below, a configuration of specifying an abnormality place by the control unit 30 is described. First, an example of specifying an abnormality place when the open abnormality has occurred in the second switch S2-1 is described. FIG. 8 depicts a voltage of the capacitor C when the open abnormality has occurred in the second switch S2-1.

First, when the open abnormality has occurred in the second switch S2-1 to be connected to the battery stack B1-1, the discharging through the second discharging path P3 and the charging by the battery stack B1-2 are performed but the discharging through the first discharging path P2 and the charging by the battery stack B1-1 are not performed.

Therefore, as shown in FIG. 8, even when the first discharging path P2 is selected after the capacitor C is charged by the battery stack B1-2, the capacitor C is somewhat discharged due to the influence of the parasitic resistance and the like but keeps the charging voltage of the battery stack B1-2. In this case, the control unit 30 determines that the discharging through the first discharging path P2 is not performed, and selects the second discharging path P3. Thereby, the capacitor C is discharged and the discharging voltage becomes zero.

When the capacitor C is discharged through the second discharging path P3, the control unit 30 selects the charging path P1 so as to charge the capacitor C by the battery stack B1-1. However, since the open abnormality has occurred in the second switch S2-1 to be connected to the battery stack B1-1, the capacitor C is not charged and the charging voltage of the capacitor C becomes zero. Then, the control unit 30 selects the first discharging path P2 so as to discharge the capacitor C. In this case, the capacitor C keeps the charging voltage, and the voltage of the capacitor C becomes zero. In this case, the control unit 30 does not select the second discharging path P3 after selecting the first discharging path P2, and selects the charging path P1a so as to charge the capacitor C by the battery stack B1-2.

Therefore, after the discharging through the second discharging path P3, when the charging voltage of the capacitor C charged through the charging path P1 including the battery stack B1-1 is equal to or less than the predetermined threshold Vth, the determination unit 33 determines that the open abnormality has occurred in the second switch S2-1, which is included on the charging path P1 including the battery stack B1-1 and is also included on the first discharging path P2.

Figure 9:
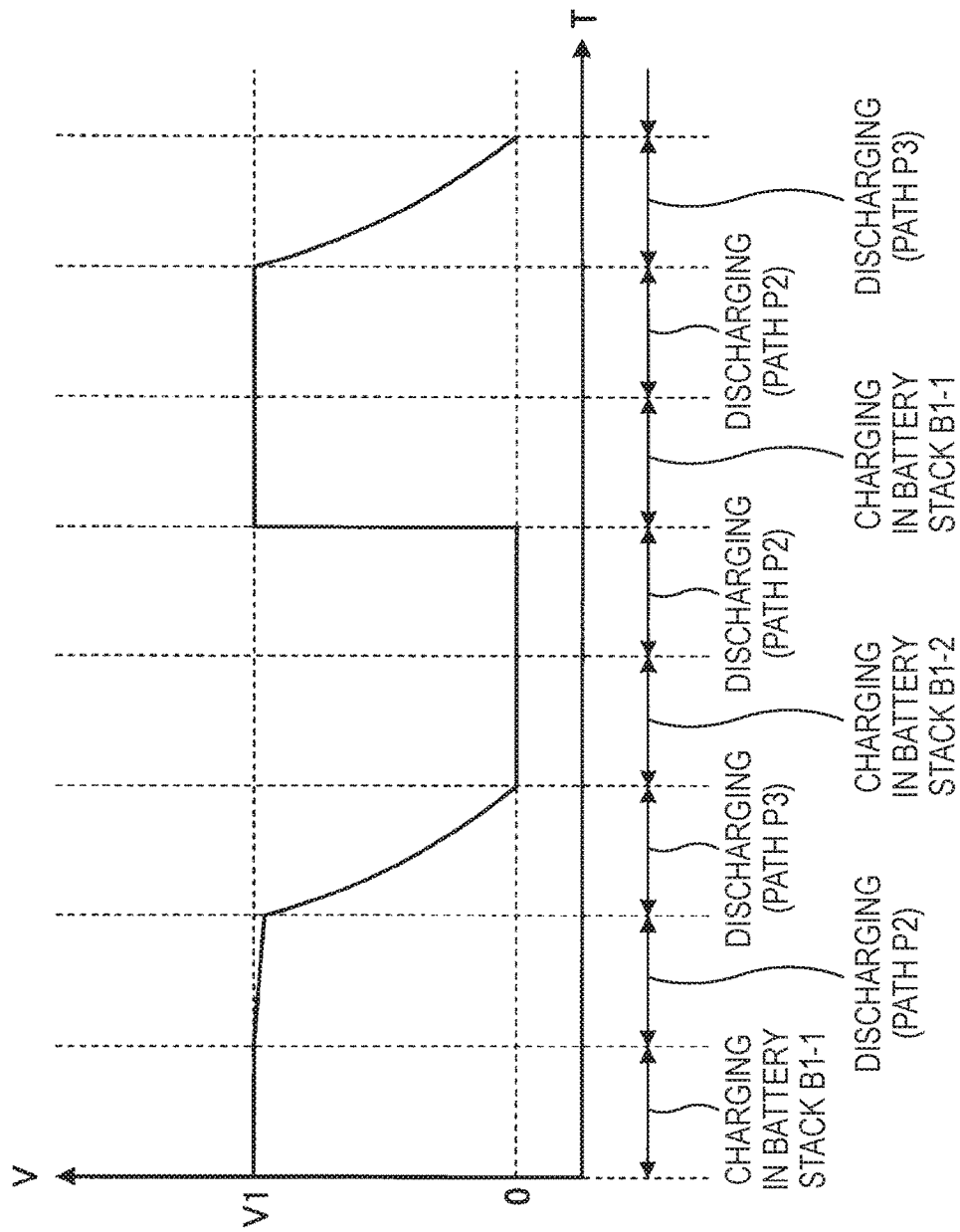
FIG. 9 depicts a voltage of the capacitor when the open abnormality has occurred in the first switch.

Subsequently, an example of specifying an abnormality place when the open abnormality has occurred in the first switch S1-2 is described. FIG. 9 depicts a voltage of the capacitor C when the open abnormality has occurred in the first switch S1-2.

When the open abnormality has occurred in the first switch S1-2 to be connected to the battery stack B1-2, the discharging through the second discharging path P3 and the charging by the battery stack B1-1 are performed but the discharging through the first discharging path P2 and the charging by the battery stack B1-2 are not performed.

Therefore, as shown in FIG. 9, even when the first discharging path P2 is selected after the capacitor C is charged by the battery stack B1-1, the capacitor C is somewhat discharged due to the influence of the parasitic resistance and the like but keeps the charging voltage of the battery stack B1-1. In this case, the control unit 30 determines that the discharging through the first discharging path P2 is not performed, and selects the second discharging path P3. Thereby, the capacitor C is discharged and the discharging voltage becomes zero.

When the capacitor C is discharged through the second discharging path P3, the control unit 30 selects the charging path P1a so as to charge the capacitor C by the battery stack B1-2. However, since the open abnormality has occurred in the first switch S1-2 to be connected to the battery stack B1-2, the capacitor C is not charged and the charging voltage of the capacitor C becomes zero. Then, the control unit 30 selects the first discharging path P2 so as to discharge the capacitor C. In this case, the capacitor C keeps the charging voltage, and the voltage of the capacitor C becomes zero. In this case, the control unit 30 does not select the second discharging path P3 after selecting the first discharging path P2, and selects the charging path P1 so as to charge the capacitor C by the battery stack B1-1.

Therefore, after the discharging through the second discharging path P3, when the charging voltage of the capacitor C charged through the charging path P1a including the battery stack B1-2 is equal to or less than the predetermined threshold Vth, the determination unit 33 determines that the open abnormality has occurred in the first switch S1-2, which is included on the charging path P1a including the battery stack B1-2 and is also included on the first discharging path P2.

Figure 10:
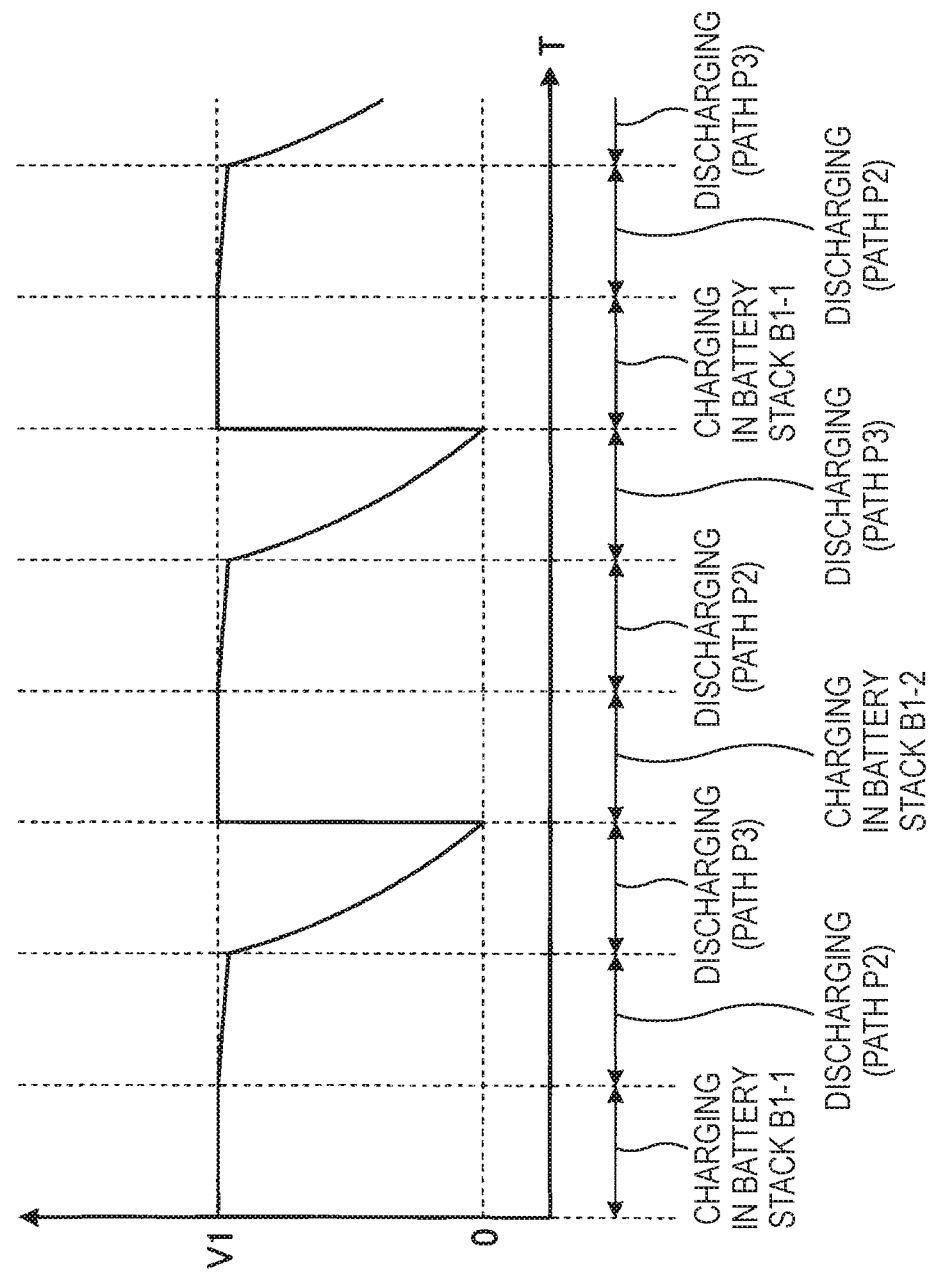
FIG. 10 depicts a voltage of the capacitor when the open abnormality has occurred in the connection member.

Subsequently, an example of specifying an abnormality place when the open abnormality has occurred in the connection member L10 is described. FIG. 10 depicts a voltage of the capacitor C when the open abnormality has occurred in the connection member L10.

When the open abnormality has occurred in the connection member L10, the discharging through the second discharging path P3 and the charging by the battery stack B1 are performed but the discharging through the first discharging path P2 is not performed.

Therefore, as shown in FIG. 10, even when the first discharging path P2 is selected after the capacitor C is charged by the battery stack B1-1, the capacitor C is somewhat discharged due to the influence of the parasitic resistance and the like but keeps the charging voltage of the battery stack B1-1. In this case, the control unit 30 determines that the discharging through the first discharging path P2 is not performed, and selects the second discharging path P3. Thereby, the capacitor C is discharged and the discharging voltage becomes zero.

When the capacitor C is discharged through the second discharging path P3, the control unit 30 selects the charging path P1a so as to charge the capacitor C by the battery stack B1-2. The capacitor C is charged by the battery stack B1-2 and the charging voltage of the capacitor C becomes V1. Then, the control unit 30 selects the first discharging path P2 so as to discharge the capacitor C. Even when the first discharging path P2 is selected, the capacitor C is somewhat discharged due to the influence of the parasitic resistance and the like but keeps the charging voltage by the battery stack B1-1. In this case, the control unit 30 determines that the discharging through the first discharging path P2 is not performed, and selects the second discharging path P3. Thereby, the capacitor C is discharged and the discharging voltage becomes zero.

Here, when the charging voltage of the capacitor C charged through the charging path P1 including the battery stack B1-1 after the discharging through the second discharging path P3 is within the defined range and the charging voltage of the capacitor C charged through the charging path P1a including the battery stack B1-2 after the discharging through the second discharging path P3 is within the defined range, the determination unit 33 determines that the open abnormality has occurred in the connection member L10 included on the first discharging path P2.

In this way, when the abnormality has occurred in the first discharging path P2 and the capacitor C cannot be discharged, the second discharging path P3 different from the first discharging path P2 is selected, so that it is possible to detect the voltage of the battery stack B1 after discharging the capacitor C and to specify the abnormality place of the first discharging path P2.

In the meantime, it takes time to perform the discharging through the second discharging path P3 because the discharging time constant thereof is large. For this reason, the control unit 30 may be configured to determine whether the capacitor C is being discharged by enabling the detection unit 20 to detect the discharging voltage through the second discharging path P3 at a predetermined interval. When it is determined that the capacitor C is being discharged, the control unit 30 ends the discharging of the capacitor C before the charges of the capacitor C become zero, and detects the voltage of the battery stack B1. Thereby, it is possible to suppress the increase in the discharging time period of the capacitor C.

Also, in the above examples, when the discharging through the first discharging path P2 cannot be performed, the control unit 30 selects the second discharging path P3. However, when the control unit 30 once determines that the discharging through the first discharging path P2 cannot be performed and selects the second discharging path P3, the control unit 30 may select the second discharging path P3 next time and thereafter without selecting the first discharging path P2.

<A4-9. When Short Abnormality has Occurred in First Switch S1-1>

Figure 11:
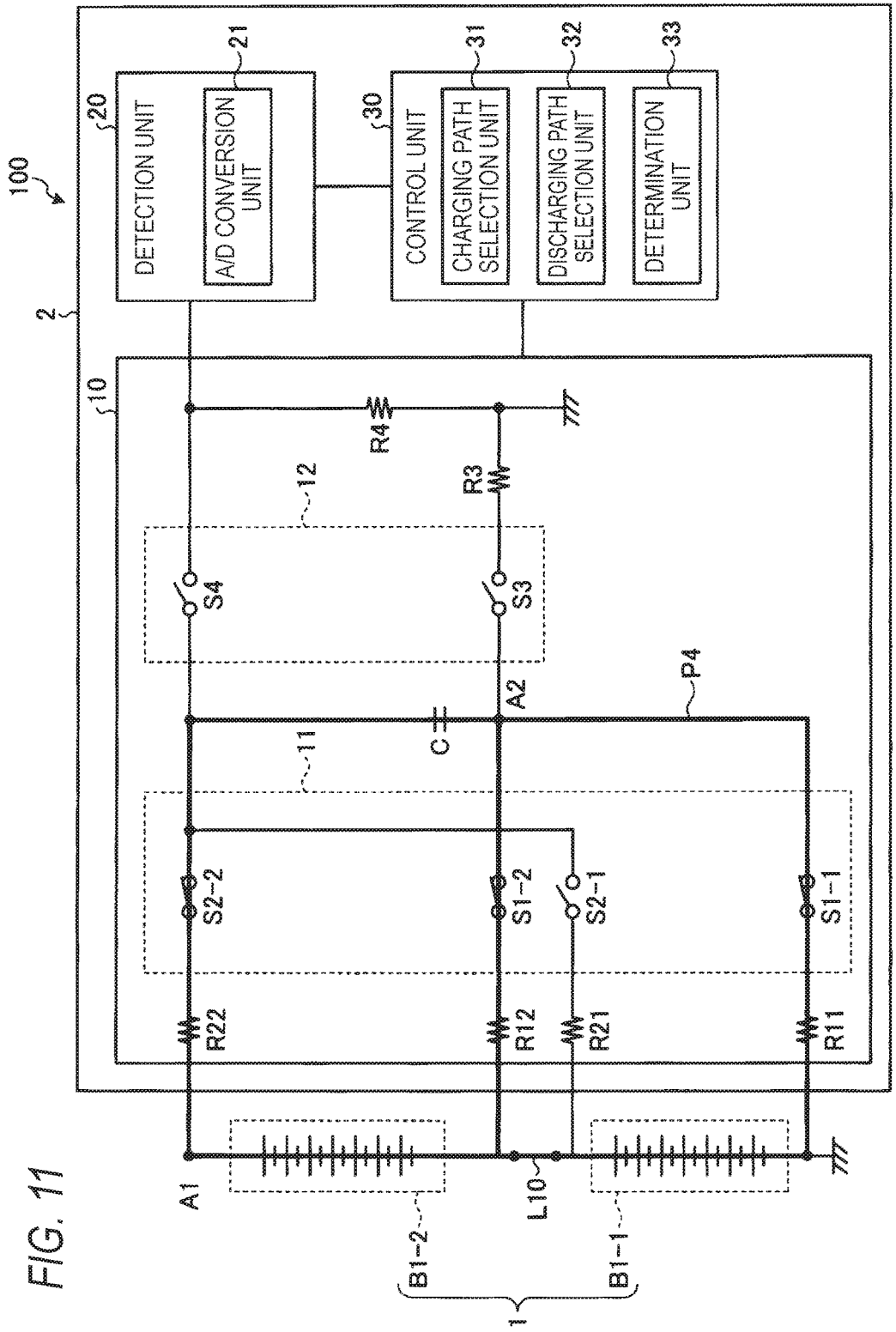
FIG. 11 depicts a close circuit that is to be formed in a flying capacitor unit when a charging path including a battery stack is selected.
Figure 12:
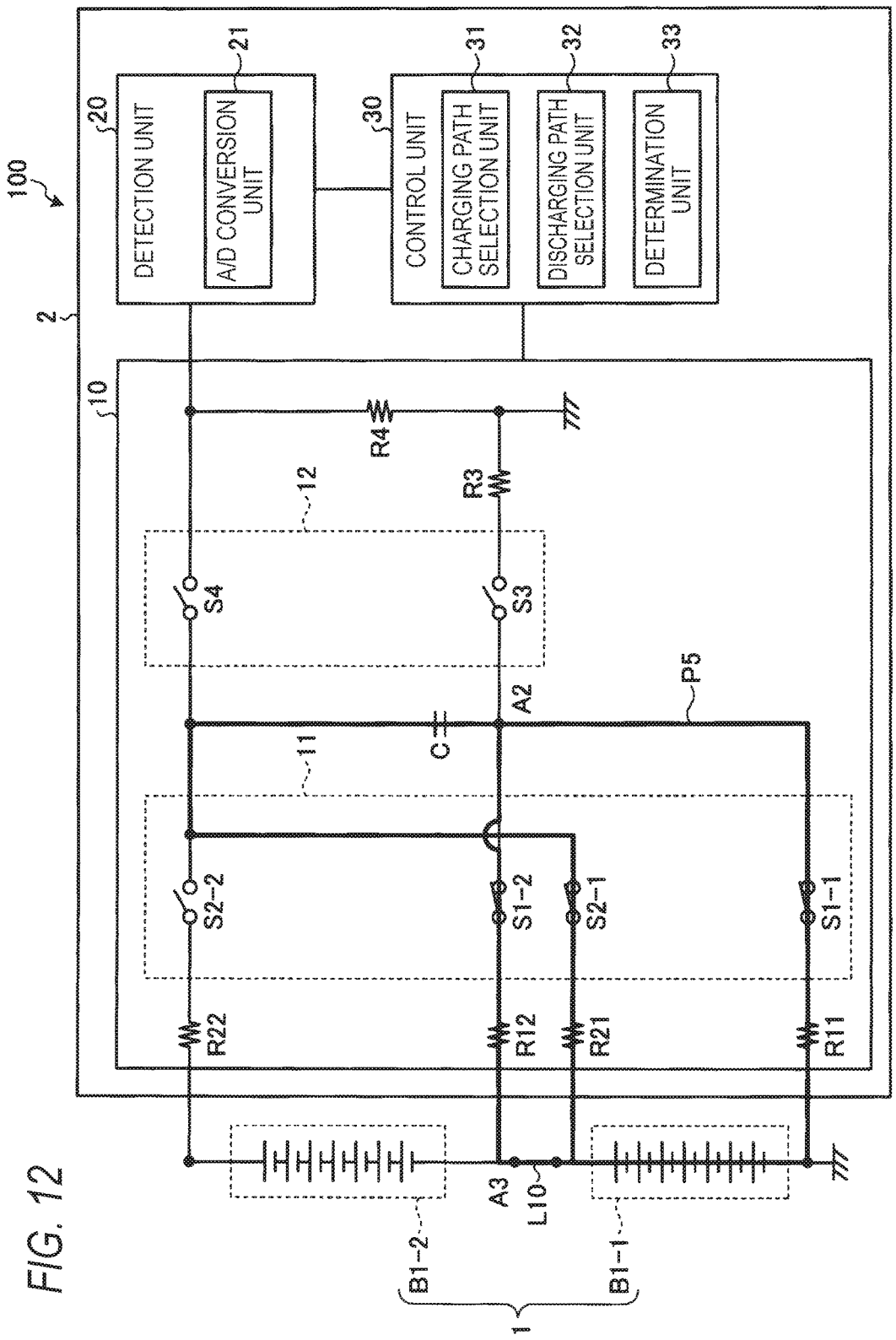
FIG. 12 depicts a close circuit that is to be formed in the flying capacitor unit when a first discharging path is selected.
Figure 13:
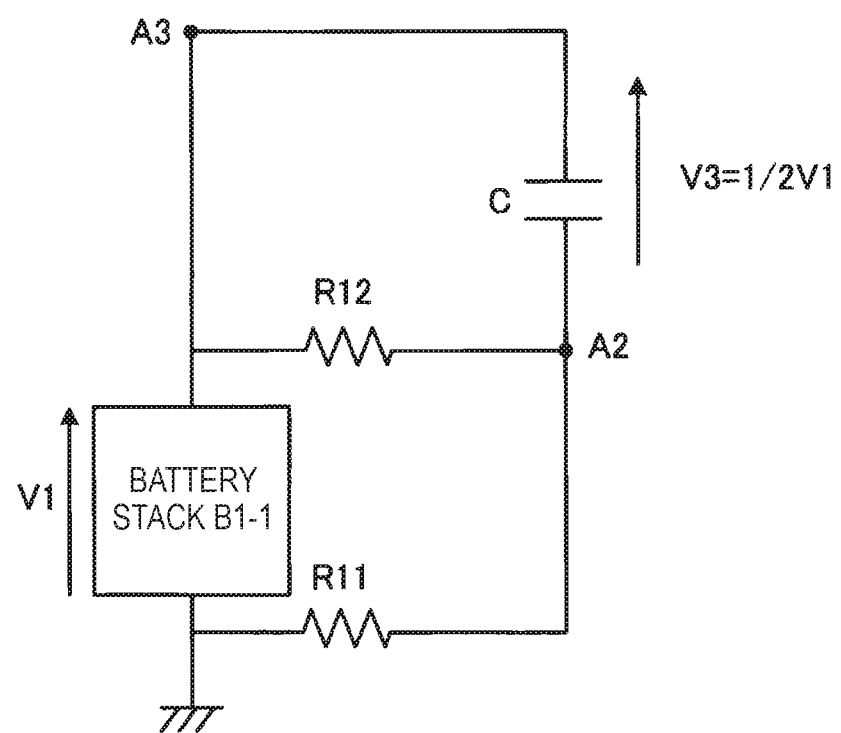
FIG. 13 depicts an equivalent circuit of the closed circuit shown in FIG. 12.
Figure 14:
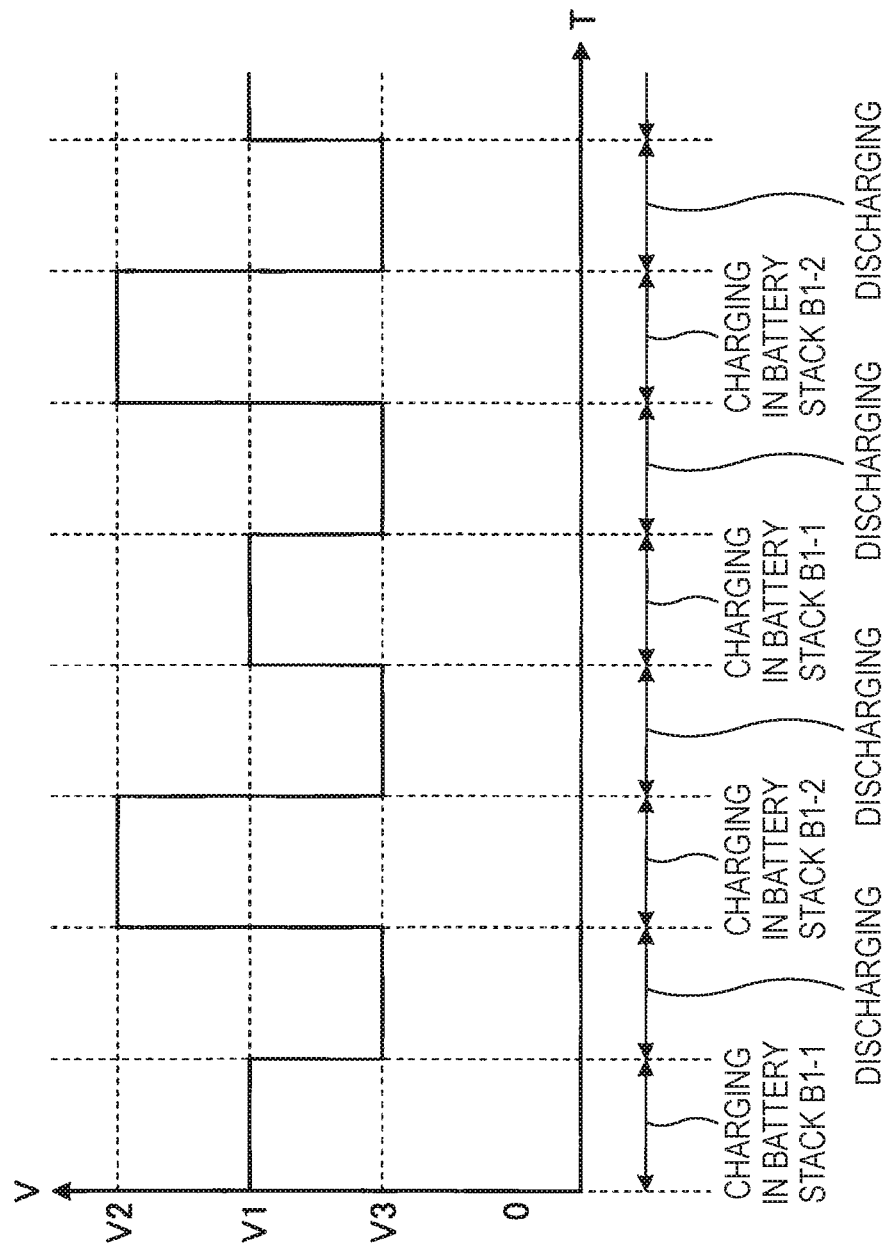
FIG. 14 depicts a voltage of the capacitor when a short abnormality has occurred in the first switch.

Subsequently, an example where the short abnormality has occurred in the first switch S1-1 is described. FIG. 11 depicts a closed circuit P5 that is to be formed in the flying capacitor unit 10 when the charging path P1a including the battery stack B1-2 is selected. Also, FIG. 12 depicts a closed circuit P4 that is to be formed in the flying capacitor unit 10 when the first discharging path P2 is selected. FIG. 13 depicts an equivalent circuit of the closed circuit P5 shown in FIG. 12. FIG. 14 depicts a voltage of the capacitor C when a short abnormality has occurred in the first switch S1-1.

When detecting the voltage of the battery stack B1-1, the control unit 30 selects the charging path P1 including the battery stack B1-1 (refer to FIG. 2). In this case, the capacitor C is charged to the voltage V1 by the battery stack B1-1.

On the other hand, when the charging path selection unit 31 selects the charging path P1a including the battery stack B1-2, since the first switch S1-1 is kept at the on state, a closed circuit P4 shown in FIG. 11 is formed in the flying capacitor unit 10. In this case, a voltage at a point A1 of the closed circuit P4 is 2×V1, which is a summed value of the voltages of the battery stacks B1-1, B1-2.

Also, a voltage at a point A2 has a value obtained by resistance-dividing the voltage of the battery stack B1-1 by the resistances R11, R12. Here, when it is assumed that the resistance values of the resistances R11, R12 are the same, the voltage at the point A2 is ½×V1, which is a half of the voltage of the battery stack B1-1.

Therefore, when a voltage drop by the resistance R22 is not considered, the voltage of the capacitor C is 2×V1−½× V1=3/2×V1. In this way, when the charging path selection unit 31 selects the charging path P1a including the battery stack B1-2, the charging voltage of the capacitor C is a voltage V2 higher than the voltage of the battery stack B1 (V2>V1, here, V2=3/2×V1).

Also, when the discharging path selection unit 32 selects the first discharging path P2, since the first switch S1-1 is kept at the on state, a closed circuit P5 shown in FIG. 12 is formed in the flying capacitor unit 10. FIG. 13 depicts an equivalent circuit of the closed circuit P5 when the voltage drop by the resistance R21 is not considered.

As shown in FIG. 13, a voltage at a point A3 is the voltage V1 of the battery stack B1-1. Also, a voltage at a point A2 has a value obtained by resistance-dividing the voltage of the battery stack B1-1 by the resistances R12, R21. Here, when it is assumed that the resistance values of the resistances R11, R12 are the same, the voltage at the point A2 is ½×V1, which is a half of the voltage of the battery stack B1-1.

For this reason, when a voltage drop by the resistance R21 is not considered, the voltage of the capacitor C is V1−½× V1=½×V1. In this way, when the charging path selection unit 31 selects the first discharging path P2, the discharging voltage of the capacitor C is a voltage V3 lower than the voltage of the battery stack B1 (V3<V1, here, V3=½×V1).

Therefore, when the short abnormality has occurred in the first switch S1-1, the voltage of the capacitor C is V1 upon the charging by the battery stack B1-1, is V3(=½×V1) upon the discharging and is V2(=3/2×V1) upon the charging by the battery stack B1-2, as shown in FIG. 14.

<A4-10. When Short Abnormality has Occurred in Second Switch S2-2>

Figure 15:
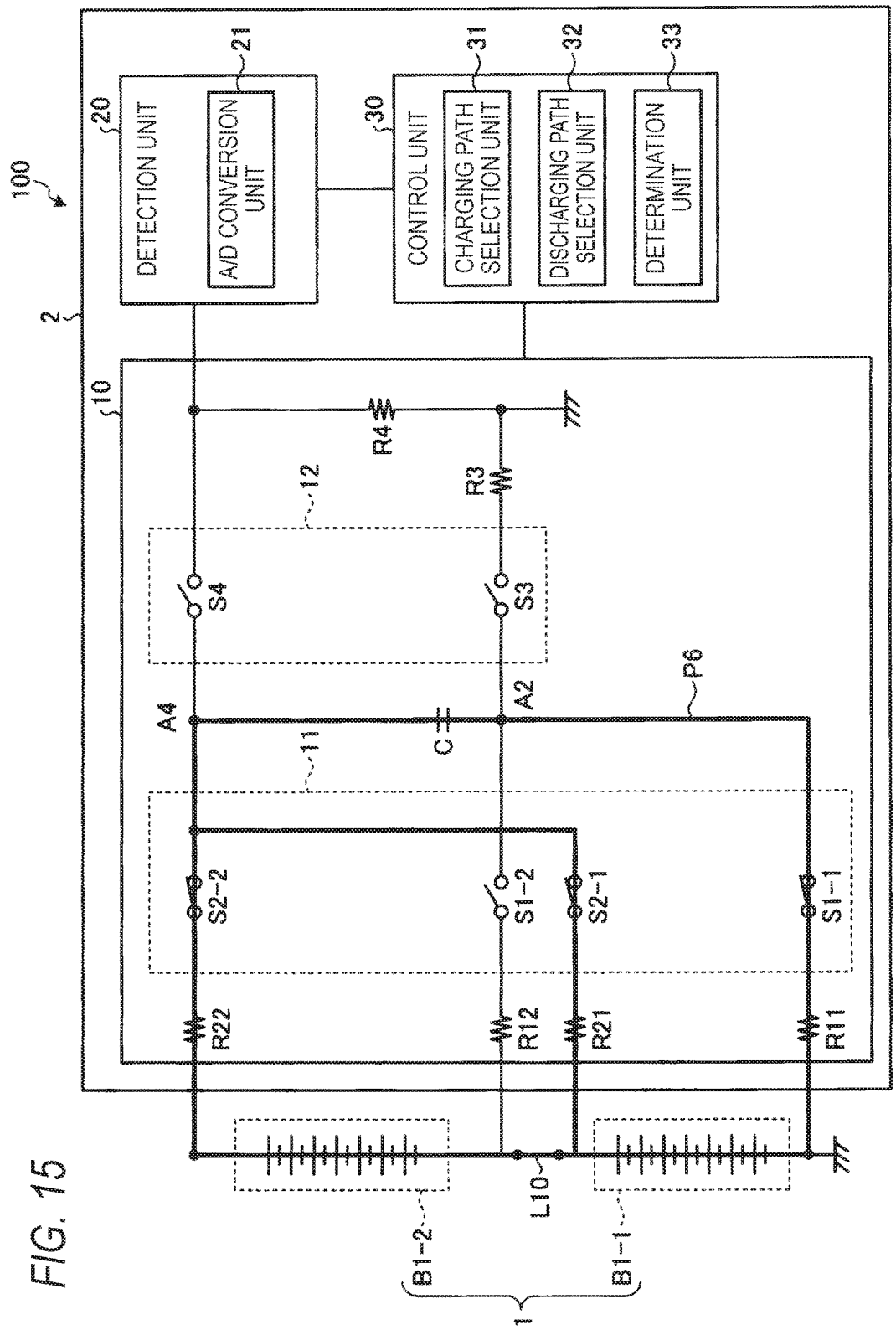
FIG. 15 depicts a close circuit that is to be formed in the flying capacitor unit when the charging path including the battery stack is selected.
Figure 16:
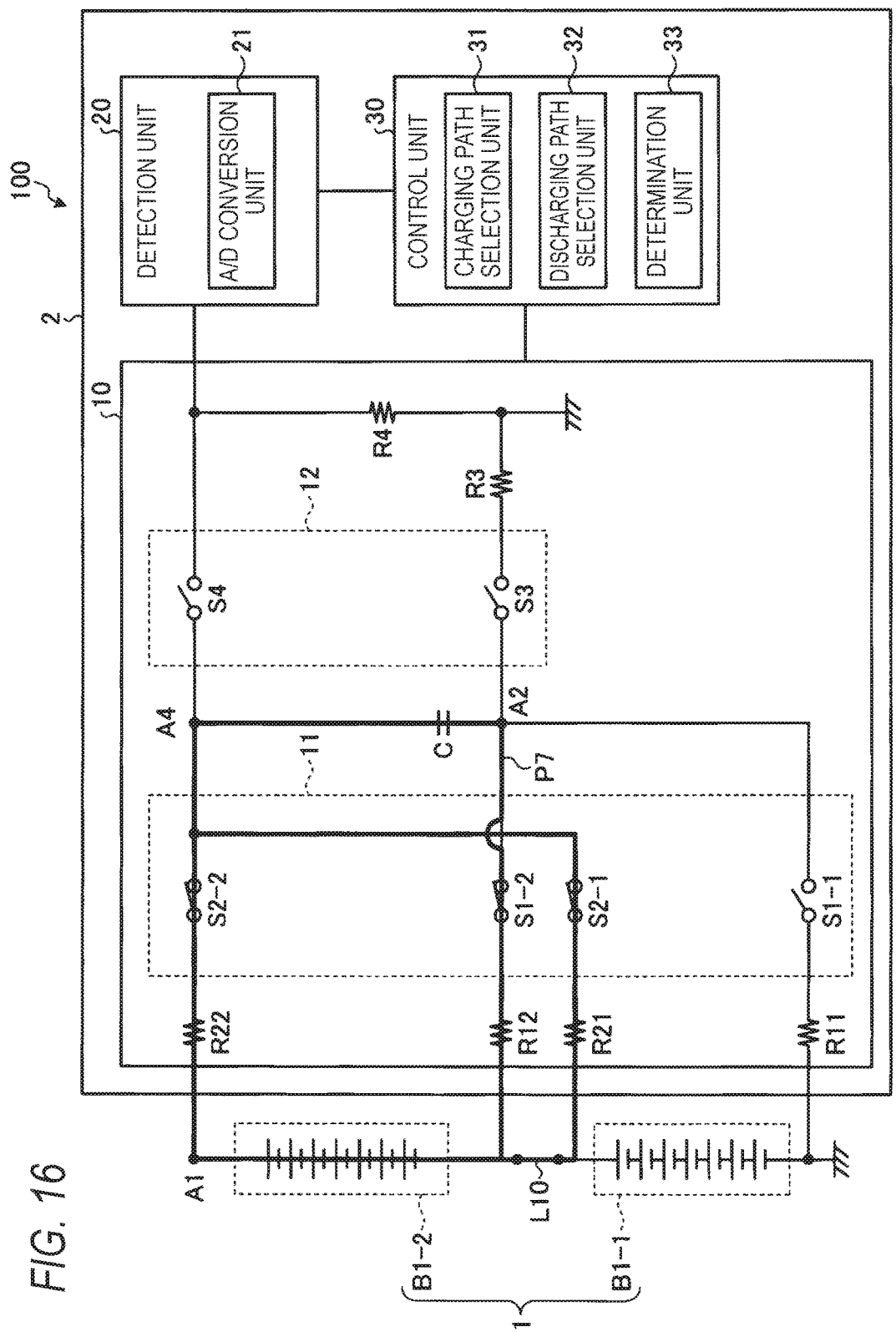
FIG. 16 depicts a close circuit that is to be formed in the flying capacitor unit when the first discharging path is selected.
Figure 17:
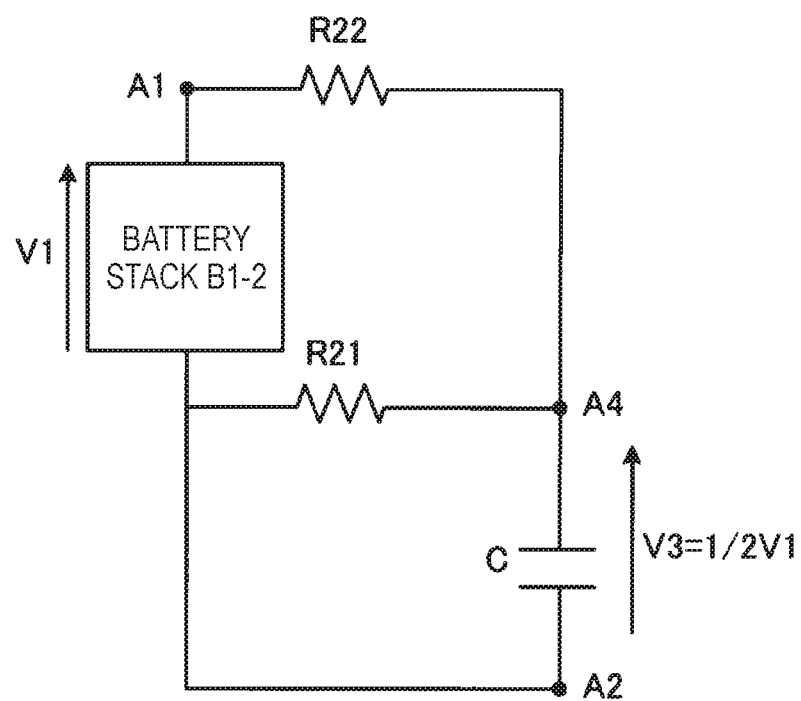
FIG. 17 depicts an equivalent circuit of the closed circuit shown in FIG. 16.
Figure 18:
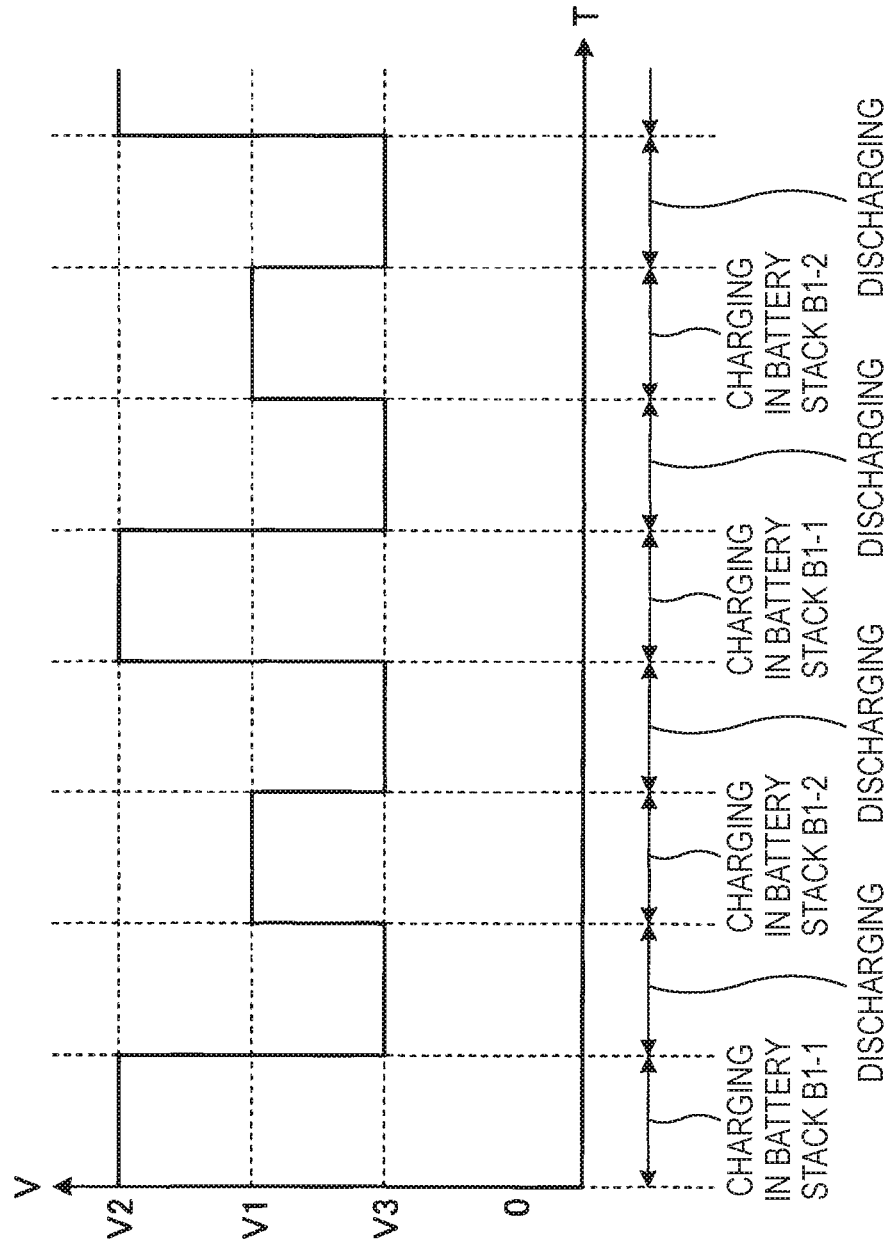
FIG. 18 depicts a voltage of the capacitor when the short abnormality has occurred in the second switch.

An example where the short abnormality has occurred in the second switch S2-2 is described. FIG. 15 depicts a closed circuit P6 that is to be formed in the flying capacitor unit 10 when the charging path P1 including the battery stack B1-1 is selected. Also, FIG. 16 depicts a closed circuit P7 that is to be formed in the flying capacitor unit 10 when the first discharging path P2 is selected. FIG. 17 depicts an equivalent circuit of the closed circuit P7 shown in FIG. 16. FIG. 18 depicts a voltage of the capacitor C when the short abnormality has occurred in the second switch S2-2.

When detecting the voltage of the battery stack B1-2, the control unit 30 selects the charging path P1a including the battery stack B1-2. In this case, the capacitor C is charged to the voltage V1 by the battery stack B1-2.

On the other hand, when the charging path selection unit 31 selects the charging path P1 including the battery stack B1-1, since the second switch S2-2 is kept at the on state, a closed circuit P6 shown in FIG. 15 is formed in the flying capacitor unit 10. In this case, a voltage at a point A4 of the closed circuit P6 is 3/2×V1, which is a summed value of the voltage, which is obtained by resistance-dividing the voltage of the battery stack B1-2 by the resistances R21, R22, and the voltage of the battery stack B1-1.

A voltage at a point A2 is a ground voltage when a voltage drop by the resistance R11 is not considered. Therefore, the voltage of the capacitor C is V2(=3/2×V1). In this way, when the charging path selection unit 31 selects the charging path P1a including the battery stack B1-2, the charging voltage of the capacitor C is a voltage V2 higher than the voltage of the battery stack B1.

Also, when the discharging path selection unit 32 selects the first discharging path P2, since the second switch S2-2 is kept at the on state, a closed circuit P7 shown in FIG. 16 is formed in the flying capacitor unit 10. FIG. 17 depicts an equivalent circuit of the closed circuit P7 when the voltage drop by the resistance R12 is not considered.

As shown in FIG. 17, a voltage at a point A1 is the voltage V1 of the battery stack B1-2. Also, a voltage at a point A4 has a value obtained by resistance-dividing the voltage of the battery stack B1-2 by the resistances R22, R21. Here, when it is assumed that the resistance values of the resistances R22, R21 are the same, the voltage at the point A4 is ½×V1, which is a half of the voltage of the battery stack B1-2.

For this reason, when a voltage drop by the resistance R12 is not considered, the voltage of the capacitor C is V1−½× V1=½×V1. In this way, when the charging path selection unit 31 selects the first discharging path P2, the discharging voltage of the capacitor C is a voltage V3 lower than the voltage of the battery stack B1.

Therefore, when the short abnormality has occurred in the second switch S2-2, the voltage of the capacitor C is V2(=3/2×V1) upon the charging by the battery stack B1-1, is V3(=½×V1) upon the discharging and is V1 upon the charging by the battery stack B1-2.

<A4-11. Short Abnormality Determination 1 by Determination Unit 33>

When the short abnormality has occurred in the second switch S2-2, which is to be connected to the battery stack B1-1 of which a voltage is to be detected via the adjacent battery stack B1-2, the charging voltage of the capacitor C becomes higher than the voltage of the battery stack B1, as described above. The reason is that the adjacent battery stack B1-2 is included on the charging path P1.

Therefore, when the charging voltage of the capacitor C is within a first range greater than the defined range, the determination unit 33 determines that the short abnormality has occurred in the second switch S2-2, which is connected to the battery stack B1-1 included on the charging path P1 via the adjacent battery stack B1-2. In the meantime, the determination unit 33 determines that the short abnormality has occurred in the first switch S1-1, when the battery stack included on the charging path P1a, i.e., the battery stack of which a voltage is to be detected is the battery stack B1-2, too.

<A4-12. When Short Abnormality has Occurred in Second Switch S2-1>

Figure 19:
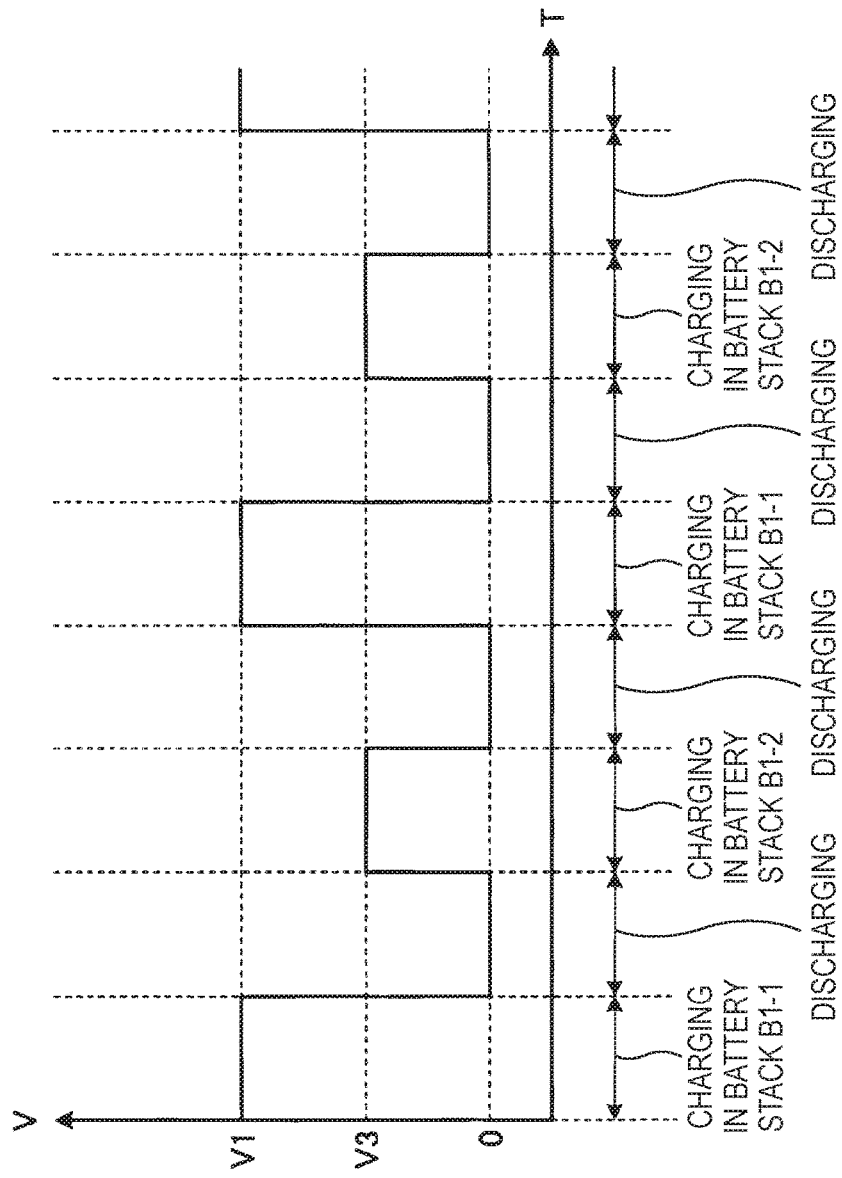
FIG. 19 depicts a voltage of the capacitor when the short abnormality has occurred in the second switch.

An example where the short abnormality has occurred in the second switch S2-1 is described. FIG. 19 depicts a voltage of the capacitor C when the short abnormality has occurred in the second switch S2-1.

When detecting the voltage of the battery stack B1-1, the control unit 30 selects the charging path P1 including the battery stack B1-1 (refer to FIG. 2). In this case, the capacitor C is charged to the voltage V1 by the battery stack B1-1. Also, when discharging the capacitor C, the control unit 30 selects the first discharging path P2 (refer to FIG. 3). In this case, the capacitor C is discharged through the first discharging path P2, and the discharging voltage thereof becomes zero.

In the meantime, when the charging path selection unit 31 selects the charging path P1a including the battery stack B1-2, since the second switch S2-1 is kept at the on state, the closed circuit P7 is formed in the flying capacitor unit 10 (refer to FIG. 16). In this case, the voltage of the capacitor C becomes the voltage V3 (V3=½×V1) lower than the voltage of the battery stack B1, as described above.

Therefore, when the short abnormality has occurred in the second switch S2-1, the voltage of the capacitor C is V1 upon the charging by the battery stack B1-1, is zero upon the discharging, and is V3(=½×V1) upon the charging by the battery stack B1-2, as shown in FIG. 19.

<A4-13. When Short Abnormality has Occurred in First Switch S1-2>

Figure 20:
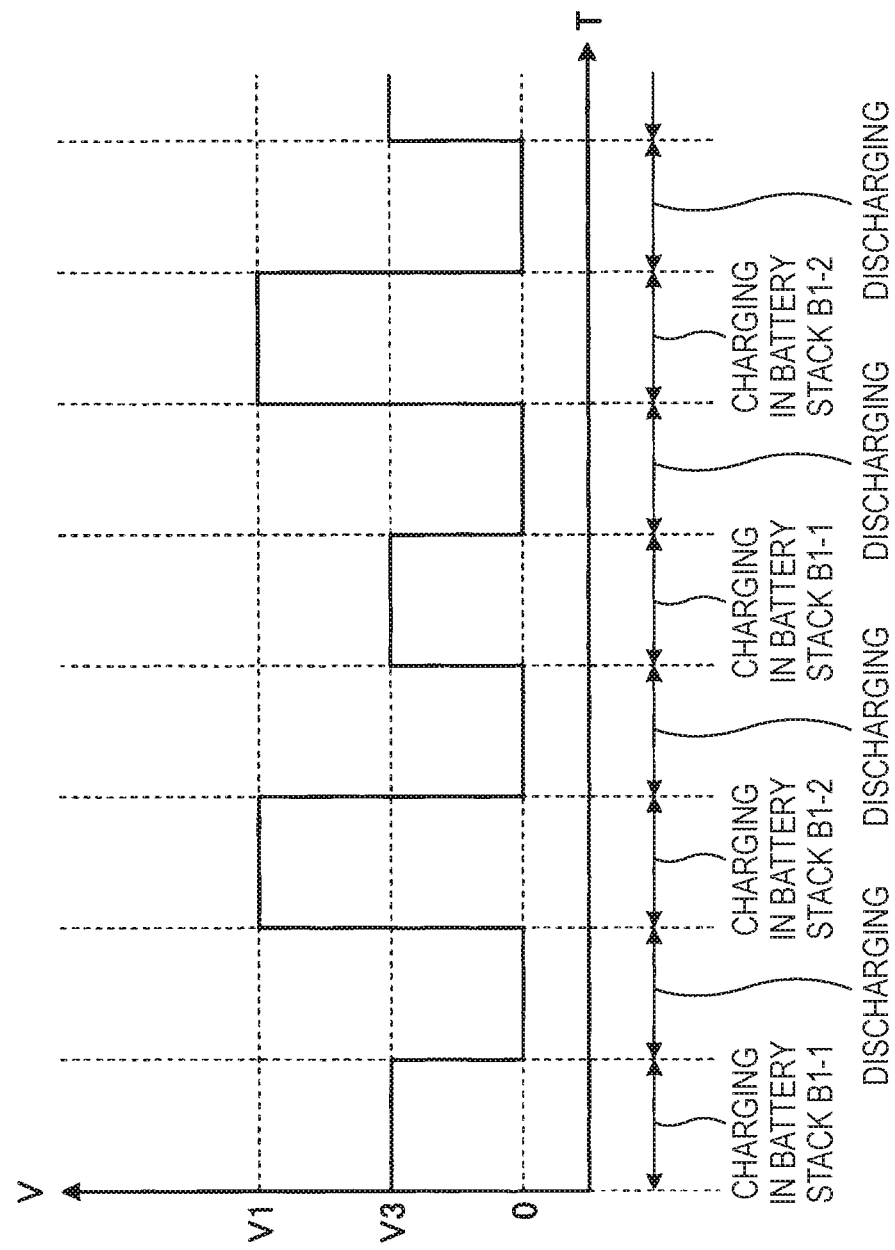
FIG. 20 depicts a voltage of the capacitor when the short abnormality has occurred in the first switch.

An example where the short abnormality has occurred in the first switch S1-2 is described. FIG. 20 depicts a voltage of the capacitor C when the short abnormality has occurred in the first switch S1-2.

When detecting the voltage of the battery stack B1-2, the control unit 30 selects the charging path P1a including the battery stack B1-2. In this case, the capacitor C is charged to the voltage V1 by the battery stack B1-2. Also, when discharging the capacitor C, the control unit 30 selects the first discharging path P2 (refer to FIG. 3). In this case, the capacitor C is discharged through the first discharging path P2, and the discharging voltage thereof becomes zero.

On the other hand, when the charging path selection unit 31 selects the charging path P1 including the battery stack B1-1, since the first switch S1-2 is kept at the on state, the closed circuit P5 is formed in the flying capacitor unit 10 (refer to FIG. 12). In this case, the voltage of the capacitor C becomes the voltage V3 (V3=½×V1) lower than the voltage of the battery stack B1, as described above.

Therefore, when the short abnormality has occurred in the first switch S1-2, the voltage of the capacitor C is V3(=½× V1) upon the charging by the battery stack B1-1, is zero upon the discharging, and is V1 upon the charging by the battery stack B1-2, as shown in FIG. 20.

<A4-14. Short Abnormality Determination 2 by Determination Unit 33>

In this way, when the short abnormality has occurred in first switch S1-2, which is connected to the battery stack B1-2 of which a voltage is to be detected via the connection member L10, the charging voltage of the capacitor C becomes lower than the voltage of the battery stack B1. The reason is that one end of the capacitor C is connected to the positive terminal of the battery stack B1-1 via the resistance R12 and is also connected to the negative terminal of the battery stack B1-2 via the resistance R21.

Therefore, when the charging voltage by the battery stack B1-2 is within a second range smaller than the defined range and greater than the predetermined threshold Vth, the determination unit 33 determines that the short abnormality has occurred in the second switch S2-1, which is connected to the battery stack B1-2 included on the charging path P1a via the connection member L10. In the meantime, the determination unit 33 also determines that the short abnormality has occurred in the first switch S1-2, when the battery stack included on the charging path P1, i.e., the battery stack of which a voltage is to be detected is the battery stack B1-1, too.

<A5. Voltage Detection Processing>

Figure 21:
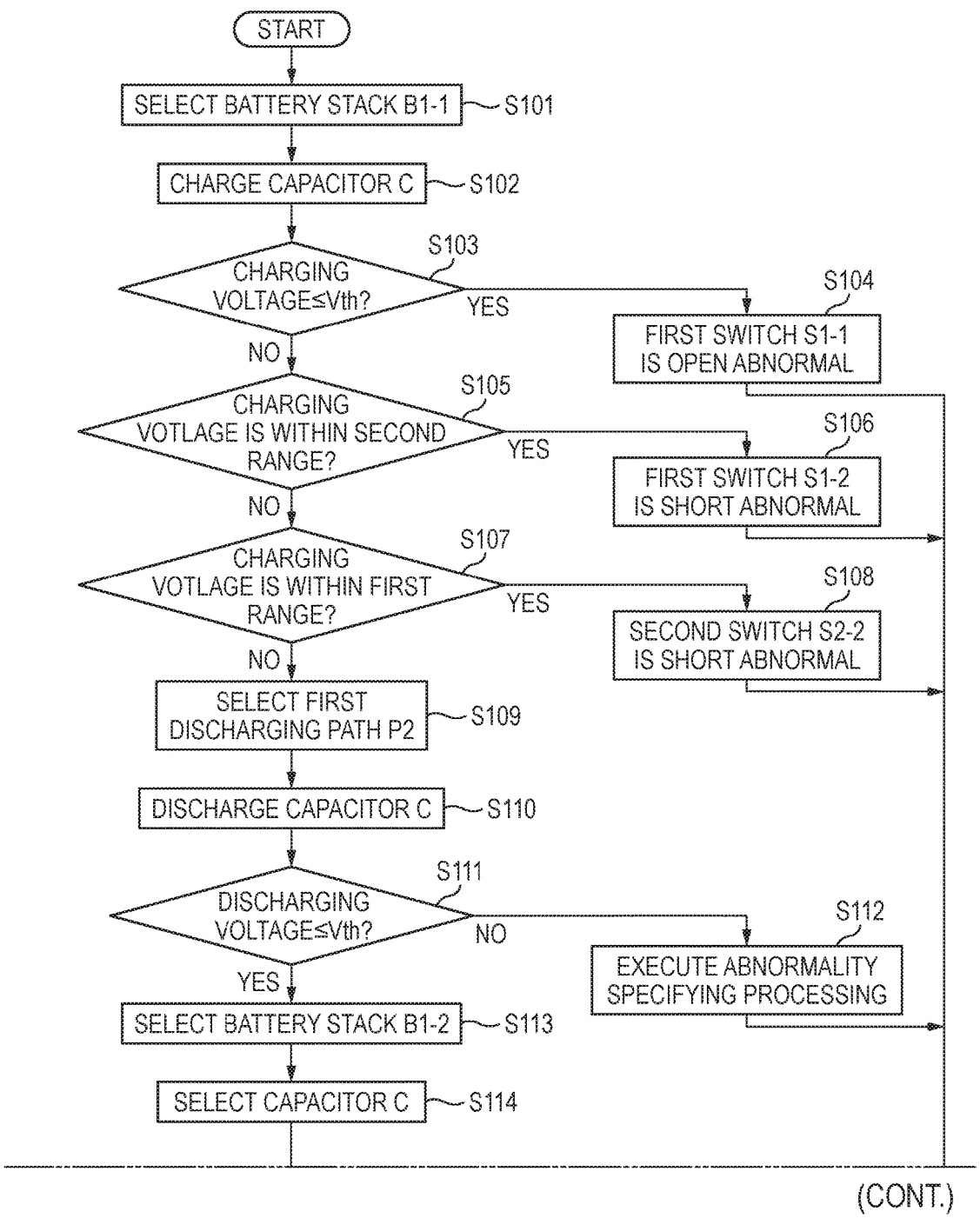
FIG. 21 is a flowchart depicting an example of a processing sequence of voltage detection processing.

Subsequently, voltage detection processing that is to be executed by the control unit 30 is described with reference to FIG. 21. FIG. 21 is a flowchart depicting an example of a processing sequence of the voltage detection processing. Here, an example where the control unit 30 detects the respective voltages of the battery stacks B1-1, B1-2 and performs the abnormality determination is described.

First, the control unit 30 selects the battery stack B1-1 as the battery stack of which a voltage is to be detected, and selects the charging path P1 including the battery stack B1-1 (step S101). Then, the control unit 30 controls the first and second switching units 11, 12, and charges the capacitor C by the battery stack B1-1 (step S102). Specifically, the control unit 30 performs the control so that the first and second switches S1-1, S2-1 of the first switching unit 11 become on and the first and second switches S1-2, S2-2 of the first switching unit 11 and the third and fourth switches S3, S4 of the second switching unit 12 become off. Thereby, the voltage of the battery stack B1-1 is charged to the capacitor C.

After controlling the first and second switching units 11, 12 in step S102, the control unit 30 stands by until a predetermined time period T1 preset to complete the charging of the capacitor C elapses. After the predetermined time period T1 elapses, the control unit 30 forms the closed circuit of the second discharging path P3 and controls the first and second switching units 11, 12 so that the charging voltage of the capacitor C is detected as the voltage of the battery stack B1-1. Specifically, the control unit 30 performs the control so that the first and second switches S1, S2 of the first switching unit 11 become off and the third and fourth switches S3, S4 of the second switching unit 12 become on. Thereby, the detection unit 20 is connected to the capacitor C, and the voltage between both ends of the capacitor C at the moment of the connection is detected.

The control unit 30 compares the charging voltage of the capacitor C detected by the detection unit 20 and the predetermined threshold Vth (step S103). As a result of the comparison, when the charging voltage of the capacitor C is equal to or less than the predetermined threshold Vth (Yes in step S103), the control unit 30 determines that the open abnormality has occurred in the first switch S1-1 (step S104).

On the other hand, when the charging voltage of the capacitor C is greater than the predetermined threshold Vth (No in step S103), the control unit 30 determines whether the charging voltage is within the second range (step S105). When the charging voltage is within the second range (Yes in step S105), the control unit 30 determines that the short abnormality has occurred in the first switch S1-2 (step S106).

On the other hand, when the charging voltage of the capacitor C is not within the second range (No in step S105), the control unit 30 determines whether the charging voltage is within the first range (step S107). When the charging voltage is within the first range (Yes in step S107), the control unit 30 determines that the short abnormality has occurred in the second switch S2-2 (step S108).

On the other hand, when the charging voltage of the capacitor C is beyond the first range (No in step S107), the control unit 30 selects the first discharging path P2 including the connection member L10 (step S109), and discharges the capacitor C (step S110). Specifically, the control unit 30 performs the control so that the first and second switches S1-2, S2-1 of the first switching unit 11 become on and the first and second switches S1-1, S2-2 of the first switching unit 11 and the third and fourth switches S3, S4 of the second switching unit 12 become off. Thereby, the capacitor C is discharged.

After controlling the first and second switching units 11, 12 in step S110, the control unit 30 stands by until a predetermined time period T2 preset to complete the discharging of the capacitor C elapses. After the predetermined time period T2 elapses, the control unit 30 forms the closed circuit of the second discharging path P3 and controls the first and second switching units 11, 12 so that the discharging voltage of the capacitor C is detected as the voltage of the battery stack B1-1. Specifically, the control unit 30 performs the control so that the first and second switches S1, S2 of the first switching unit 11 become off and the third and fourth switches S3, S4 of the second switching unit 12 become on. Thereby, the detection unit 20 is connected to the capacitor C, and the voltage between both ends of the capacitor C at the moment of the connection is detected. In this way, when detecting the charging voltage or discharging voltage of the capacitor C by the detection unit 20, the control unit 30 selects the second discharging path P3, as described above. The control unit 30 detects the charging voltage or discharging voltage of the capacitor C by the same manner. Therefore, the descriptions thereof are omitted.

Then, the control unit 30 compares the discharging voltage detected by the detection unit 20 and the predetermined threshold Vth (step S111). As a result of the comparison, when the discharging voltage of the capacitor C is greater than the predetermined threshold Vth (No in step S111), the control unit 30 executes abnormality specifying processing (step S112). The abnormality specifying processing will be described later with reference to FIG. 22.

When the discharging voltage of the capacitor C is equal to or less than the predetermined threshold Vth (Yes in step S111), the control unit 30 selects the battery stack B1-2, as the battery stack of which a voltage is to be detected, and selects the charging path P1a including the battery stack B1-2 (step S113).

Then, the control unit 30 controls the first and second switching units 11, 12 and charges the capacitor C by the battery stack B1-2 (step S114). The control unit 30 compares the charging voltage of the capacitor C and the predetermined threshold Vth (step S115). As a result of the comparison, when the charging voltage of the capacitor C is equal to or less than the predetermined threshold Vth (Yes in step S115), the control unit 30 determines that the open abnormality has occurred in the second switch S2-2 (step S116).

On the other hand, when the charging voltage of the capacitor C is greater than the predetermined threshold Vth (No in step S115), the control unit 30 determines whether the charging voltage is within the second range (step S117). When the charging voltage is within the second range (Yes in step S117), the control unit 30 determines that the short abnormality has occurred in the second switch S2-1 (step S118).

On the other hand, when the charging voltage of the capacitor C is beyond the second range (No in step S117), the control unit 30 determines whether the charging voltage is within the first range (step S119). When the charging voltage is within the first range (Yes in step S119), the control unit 30 determines that the short abnormality has occurred in the first switch S1-1 (step S120).

On the other hand, when the charging voltage of the capacitor C is beyond the first range (No in step S119), the control unit 30 selects the first discharging path P2 including the connection member L10 (step S121), discharges the capacitor C (step S122), and ends the voltage detection processing.

<A6. Abnormality Specifying Processing>

Figure 22:
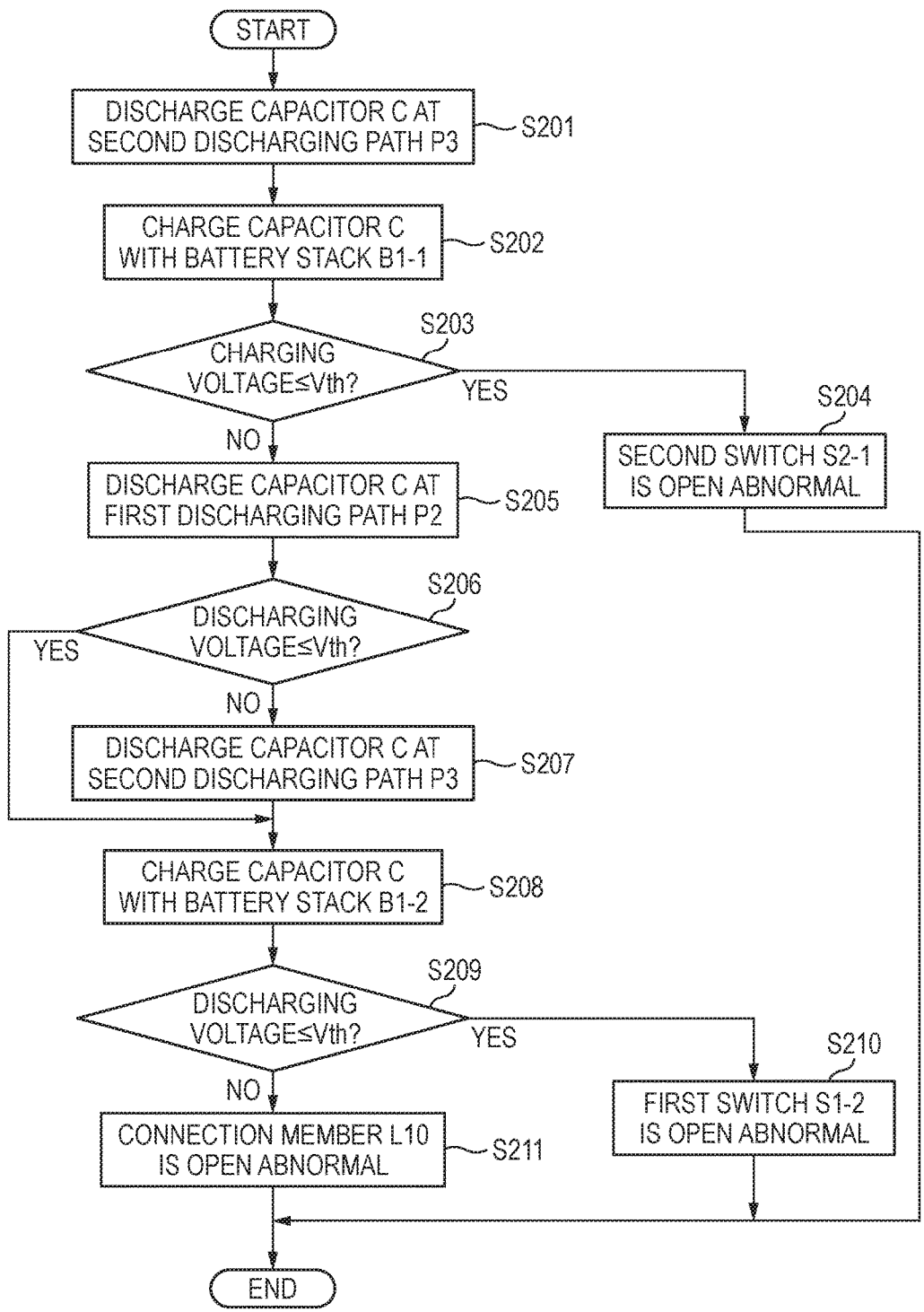
FIG. 22 is a flowchart depicting an example of a processing sequence of abnormality specifying processing that is to be executed by a control unit.

The abnormality specifying processing that is to be executed by the control unit 30 is described with reference to FIG. 22. FIG. 22 is a flowchart depicting an example of a processing sequence of the abnormality specifying processing.

First, the control unit 30 selects the second discharging path P3 including the resistances R3, R4, and discharges the capacitor C through the second discharging path P3 (step S201). Then, the control unit 30 selects the charging path P1 including the one battery stack B1-1, which is connected via the connection member L10 included on the first discharging path P2, and charges the capacitor C by the battery stack B1-1 (step S202).

After charging the capacitor C, the control unit 30 compares the charging voltage and the predetermined threshold Vth (step S203). As a result of the comparison, when the charging voltage of the capacitor C is equal to or less than the predetermined threshold Vth (Yes in step S203), the control unit 30 determines that the open abnormality has occurred in the second switch S2-1 (step S204).

On the other hand, when the charging voltage of the capacitor C is greater than the predetermined threshold Vth (No in step S203), the control unit 30 selects the first discharging path P2, and discharges the capacitor C through the first discharging path P2 (step S205). Then, the control unit 30 compares the discharging voltage and the predetermined threshold Vth (step S206). As a result of the comparison, when the discharging voltage of the capacitor C is greater than the predetermined threshold Vth (No in step S206), the control unit 30 selects the second discharging path P3, and discharges the capacitor C through the second discharging path P3 (step S207). Then, the control unit 30 selects the charging path P1a including the other battery stack B1-2, which is connected via the connection member L10 included on the first discharging path P2, and charges the capacitor C by the battery stack B1-2 (step S208). On the other hand, when the discharging voltage of the capacitor C is equal to or less than the predetermined threshold Vth (Yes in step S206), the control unit 30 proceeds to step S208 without selecting the second discharging path P3.

After charging the capacitor C in step S208, the control unit 30 compares the charging voltage and the predetermined threshold Vth (step S209). As a result of the comparison, when the charging voltage of the capacitor C is equal to or less than the predetermined threshold Vth (Yes in step S209), the control unit 30 determines that the open abnormality has occurred in the first switch S1-2 (step S210).

On the other hand, when the charging voltage of the capacitor C is greater than the predetermined threshold Vth (No in step S209), the control unit 30 determines that the open abnormality has occurred in the connection member L10 (step S211).

B. Second Illustrative Embodiment

Hereinafter, a second illustrative embodiment is described. In the below, regarding the same configurations as the first illustrative embodiment, the descriptions thereof are appropriately omitted, and the differences from the first illustrative embodiment are mainly described.

<B1. Configuration of Battery Pack System>

The control unit 30 is configured to control the first switching unit 11 and the second switching unit 12. The control unit 30 has the charging path selection unit 31, the discharging path selection unit 32 and the determination unit 33. The charging path selection unit 31 selects the charging path P1 (refer to the charging path P1 of FIG. 2) including the battery stack B1 of which a voltage is to be detected and the capacitor C when charging the capacitor C. The discharging path selection unit 32 selects the discharging path P3 until the voltage of the capacitor C is detected by the detection unit 20. Also, the discharging path selection unit 32 selects the discharging path P2 including the capacitor C and the connection member L10 when discharging the capacitor C after detecting the voltage of the capacitor C.

The determination unit 33 is configured to determine whether or not an abnormality of the battery pack 1, based on the voltage of the capacitor C after discharging the capacitor C through the discharging path P2. Specifically, the determination unit 33 determines that the open abnormality has occurred in the connection member L10 included on the discharging path P2, when the discharging voltage of the capacitor C is greater than the threshold. The abnormality determination by the determination unit 33 will be described in detail later with reference to FIG. 23.

The control unit 30 is configured to control the first switching unit 11 and the second switching unit 12 so that the charging path P1 is selected upon the charging of the capacitor C and the discharging path P2 is selected upon the discharging. Also, the control unit 30 is configured to control the detection unit 20 to detect the charging voltage or discharging voltage of the capacitor C, and is also configured to control the first switching unit 11 and the second switching unit 12 so that the discharging path P3 is selected upon the voltage detection and the capacitor C and the detection unit 20 are connected with the capacitor C and the battery stack B1 being separated. Also, the control unit 30 is configured to monitor a charging status of the battery stack B1 on the basis of the voltage of the battery stack B1 detected by the detection unit 20.

<B2. Abnormality Determination by Determination Unit 33>

Figure 23:
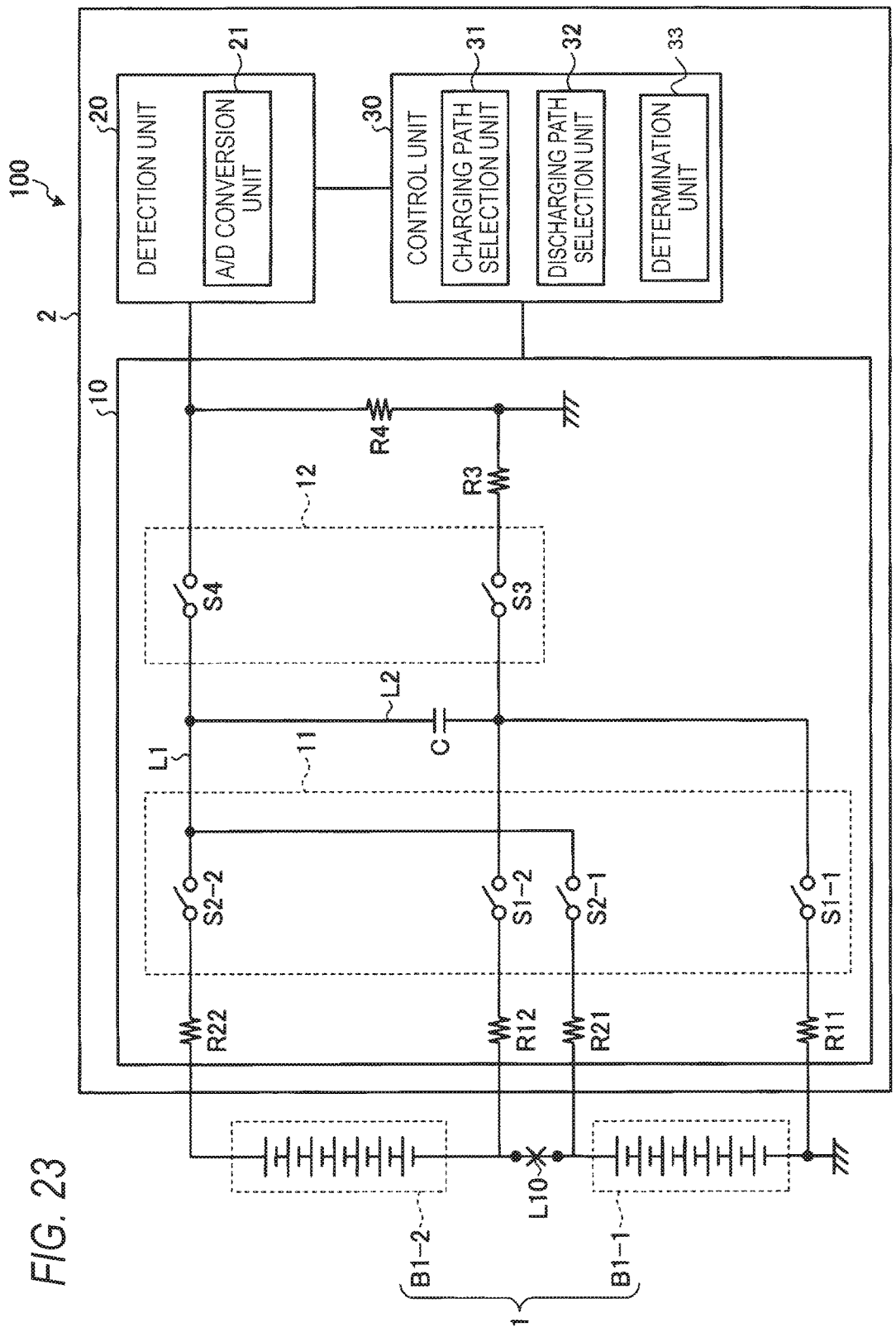
FIG. 23 depicts abnormality determination for a battery pack by the control unit.

The other abnormality determination for the battery pack 1, which is to be performed by the determination unit 33 of the control unit 30, is described in detail with reference to FIG. 23. FIG. 23 depicts the abnormality determination for the battery pack 1 by the control unit 30 according to the second illustrative embodiment.

An open abnormality may occur between the battery stacks B1-1, B1-2 due to the disconnection of the connection member L10 or when the connection member L10 is not arranged upon assembling of the battery pack 1. For example, when a fuse is used as the connection member L10 so as to protect the battery pack 1, if large current flows through the battery pack 1, the fuse (the connection member L10) is disconnected. The determination unit 33 of the control unit 30 is configured to determine whether the open abnormality has occurred between the battery stacks B1.

Specifically, the determination unit 33 is configured to determine whether the open abnormality has occurred in the battery pack 1, based on the discharging voltage of the capacitor C. In the below, the reason that it is possible to determine whether or not the open abnormality on the basis of the discharging voltage of the capacitor C is described.

As described above with reference to FIG. 3, the control unit 30 selects the path including the connection member L10, as the discharging path P2. Thereby, the closed circuit including the connection member L10 is formed in the flying capacitor unit 10, and the capacitor C is discharged.

However, as shown in FIG. 23, when the open abnormality has occurred in the battery pack 1, due to the disconnection of the connection member L10 and the like, a part of the discharging path P2 is disconnected, so that the closed circuit is not formed in the flying capacitor unit 10. For this reason, the capacitor C is not discharged and keeps the charging voltage.

Therefore, when the discharging voltage of the capacitor C is greater than the threshold Vth, the determination unit 33 determines that the capacitor C is not being discharged, i.e., the open abnormality has occurred in the battery pack 1.

In the meantime, the threshold Vth may be a preset value or may be set by the determination unit 33, depending on the charging voltage of the capacitor C. When the determination unit 33 sets the threshold Vth, depending on the charging voltage of the capacitor C, the determination unit 33 sets the threshold Vth so that it is less than the voltage between both ends of the capacitor detected by the detection unit 20. At a state where the discharging voltage is equal to or greater than the threshold Vth, the determination unit 33 determines that the open abnormality has occurred. In this way, it is possible to change the value of the threshold, depending on the charging voltage of the capacitor C, so that even when the charging voltage of the capacitor C is changed, the determination unit 33 can determine that the open abnormality has occurred in the battery pack 1.

Also, the threshold Vth may be determined depending on a transient response of the capacitor C. At this time, the control unit 30 may be configured to compare the voltage of the capacitor C, which is being discharged, and the threshold Vth and to determine whether the capacitor C is being discharged by determining whether the discharging voltage is lower than the charging voltage. In this way, it is possible to shorten the determination time as to the abnormality of the battery pack 1 by determining whether an abnormality has occurred in the battery pack 1 during the discharging of the capacitor C.

<B3. Abnormality Determination Processing>

Figure 24:
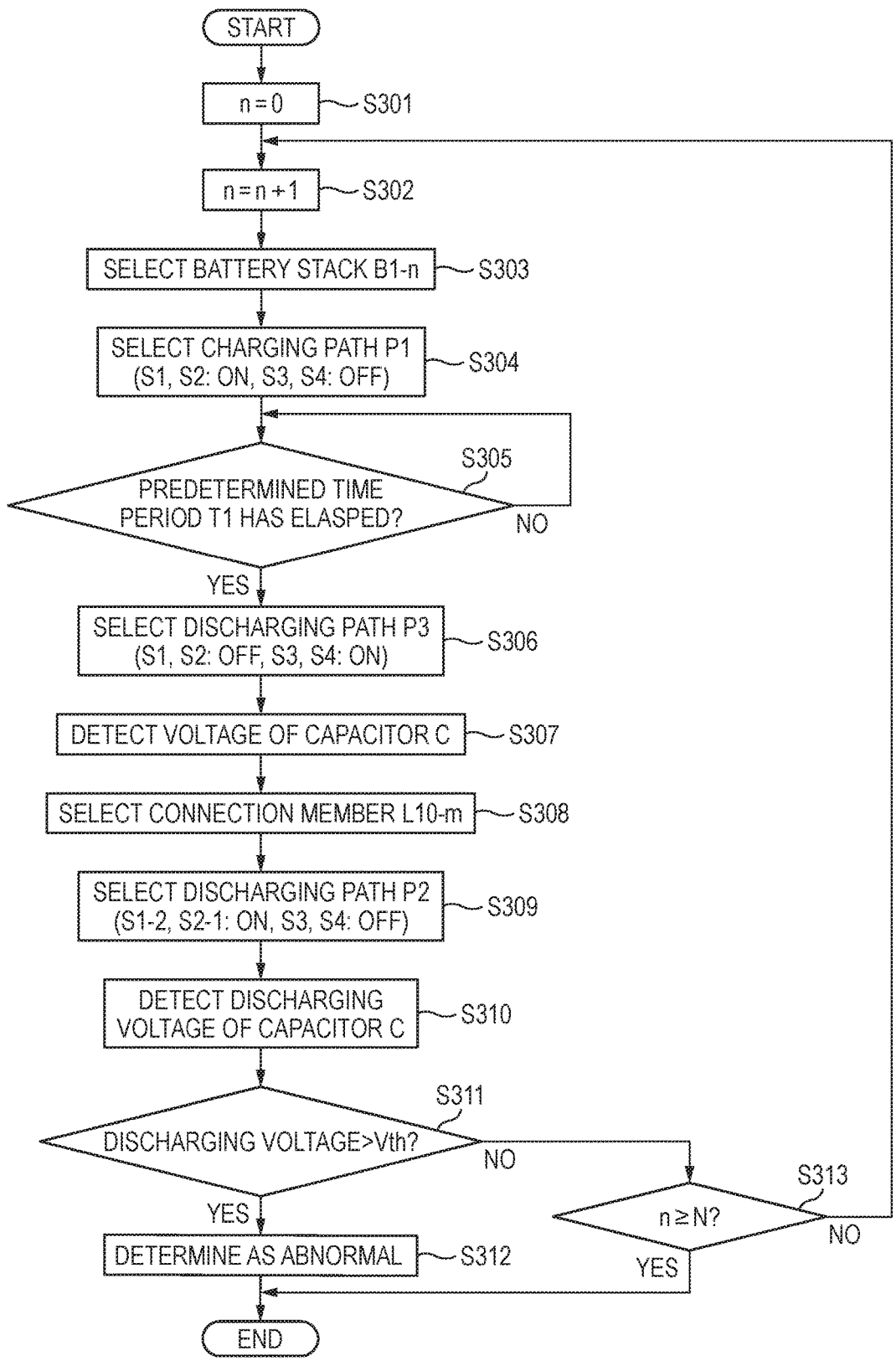
FIG. 24 is a flowchart depicting an example of a processing sequence of abnormality determination processing.

Subsequently, the abnormality determination processing that is to be executed by the control unit 30 is described with reference to FIG. 24. FIG. 24 is a flowchart depicting an example of a processing sequence of the abnormality determination processing. Here, an example where the control unit 30 executes the abnormality determination processing simultaneously with the voltage detection processing of detecting the voltage of the battery stack B1.

First, the control unit 30 initializes a stack designating variable n (n=0) (step S301), and then increments the stack designating variable n by one (n=n+1) (step S302). The control unit 30 selects the $n^{th}$ battery stack B1-$n$ as the battery stack B1 of which a voltage is to be detected (step S303). Here, since n is 1 (n=1), the control unit 30 selects the battery stack B1-1.

Then, the control unit 30 selects the charging path P1 including the battery stack B1-1 (step S304). That is, the control unit 30 controls the first and second switching units 11, 12 so that the closed circuit of the charging path P1 is formed in the flying capacitor unit 10. Specifically, the control unit 30 performs the control so that the first and second switches S1, S2 of the first switching unit 11 become on and the third and fourth switches S3, S4 of the second switching unit 12 become off. Thereby, the voltage of the battery stack B1-1 is charged to the capacitor C.

After controlling the first and second switching units 11, 12 in step S304, the control unit 30 stands by until the predetermined time period T1 preset to complete the charging of the capacitor C elapses (step S305). After the predetermined time period T1 elapses, the control unit 30 forms the closed circuit of the discharging path P3 having a large time constant and controls the first and second switching units 11, 12 so that the charging voltage of the capacitor C is detected as the voltage of the battery stack B1-1 (step S306). Specifically, the control unit 30 performs the control so that the first and second switches S1, S2 of the first switching unit 11 become off and the third and fourth switches S3, S4 of the second switching unit 12 become on. Thereby, the detection unit 20 is connected to the capacitor C, and the voltage between both ends of the capacitor C at the moment of the connection is detected (step S307).

When the detection unit 20 detects the voltage, the control unit 30 selects the connection member L10-$m$ for which it is determined whether the open abnormality has occurred (step S308). In the processing of FIG. 24, the control unit 30 selects the connection member L10 that is to be connected to the battery stack B1 of which the voltage is detected. Specifically, in a case of n<N, the control unit 30 selects the connection member L10-$n$ (m=n), and in a case of n=N, the control unit 30 selects the connection member L10-(N−1) (m=N−1).

The control unit 30 selects the discharging path P2 including the connection member L10 selected in step S308 (step S309). In this way, the control unit 30 switches the discharging path to the discharging path P2 of which the time constant is less than the discharging path P3, thereby discharging the capacitor C. In other words, in step S309, the control unit 30 selects the discharging path P3 until the detection unit 20 completes the detection of the voltage of the battery stack B1, and switches the discharging path to the discharging path P2 after the detection unit 20 completes the detection of the voltage of the battery stack B1. Specifically, the control unit 30 controls the first and second switching units 11, 12 so that the first switch S1-2 and the second switch S2-1 become on and the first switch S1-1, the second switch S2-1 and the third and fourth switches S3, S4 become off so as to form the closed circuit of the discharging path P3 in the flying capacitor unit 10.

After controlling the first and second switching units 11, 12 in step S309, the control unit 30 forms the closed circuit of the discharging path P3 having the large time constant after the predetermined time period T2 elapses and controls the first and second switching units 11, 12 so that the discharging voltage of the capacitor C is detected (step S310). Specifically, the control unit 30 performs the control so that the first and second switches S1, S2 of the first switching unit 11 become off and the third and fourth switches S3, S4 of the second switching unit 12 become on. Thereby, the detection unit 20 is connected to the capacitor C and the voltage between both ends of the capacitor C at the moment of the connection is detected.

The control unit 30 compares the discharging voltage of the capacitor C detected in step S310 and the threshold Vth (step S311). As a result of the comparison, when the discharging voltage of the capacitor C is greater than the threshold Vth (Yes in step S311), the control unit 30 determines that the open abnormality has occurred in the battery pack 1 (step S312), and ends the abnormality determination processing. That is, the control unit 30 determines that the open abnormality has occurred, when the voltage of the capacitor C after the discharging through the discharging path P2 is greater than the threshold Vh.

On the other hand, when the discharging voltage of the capacitor C is equal to or less than the threshold Vth (No in step S311), the control unit 30 determines whether the voltages of all the battery stacks B1 are detected (step S313). Specifically, when the stack designating variable n is equal to or greater than N, which is the number of the battery stacks B1 (Yes in step S313), the control unit 30 determines that the voltages of all the battery stacks B1 are detected and the battery pack 1 is normal, and ends the abnormality determination processing.

When the stack designating variable n is less than N, which is the number of the battery stacks B1 (No in step S313), the control unit 30 returns to step S302.

In the meantime, the predetermined time periods T1, T2 are the time periods that are to be determined, taking into consideration the transient response until the capacitor C reaches the normal state, and are determined by the time constants corresponding to the capacitance value of the capacitor C and the resistance values of the resistances R11, R12, R21, R22, which are included in the closed circuits of the charging path P1 and the discharging path P3.

Also, in the abnormality determination processing, the abnormality determination is performed in order from the connection member L10-1 of which a voltage potential is low. However, the disclosure is not limited thereto. For example, the abnormality determination may be performed in order from the connection member L10-1 of which a voltage potential is high, or may be randomly performed.

In the meantime, the order for determining the abnormality of the connection member L10 may be stored in a storage unit (not shown) of the monitoring device 2, for example. In this case, the order may be stored in order that the storage unit selects the connection member L10 or an order of the first and second switches S1, S2 to be on may be stored. The control unit 30 may be configured to select the connection member L10 for which it is determined whether an abnormality has occurred or the discharging path P3 by reading out the order of the connection member L10 or the first and second switch S1, S2 stored in the storage unit.

Also, the detection order of the voltages of the battery stacks B1 may be stored in the storage unit (not shown).

<B4. Another Example of Abnormality Determination Processing>

Figure 25:
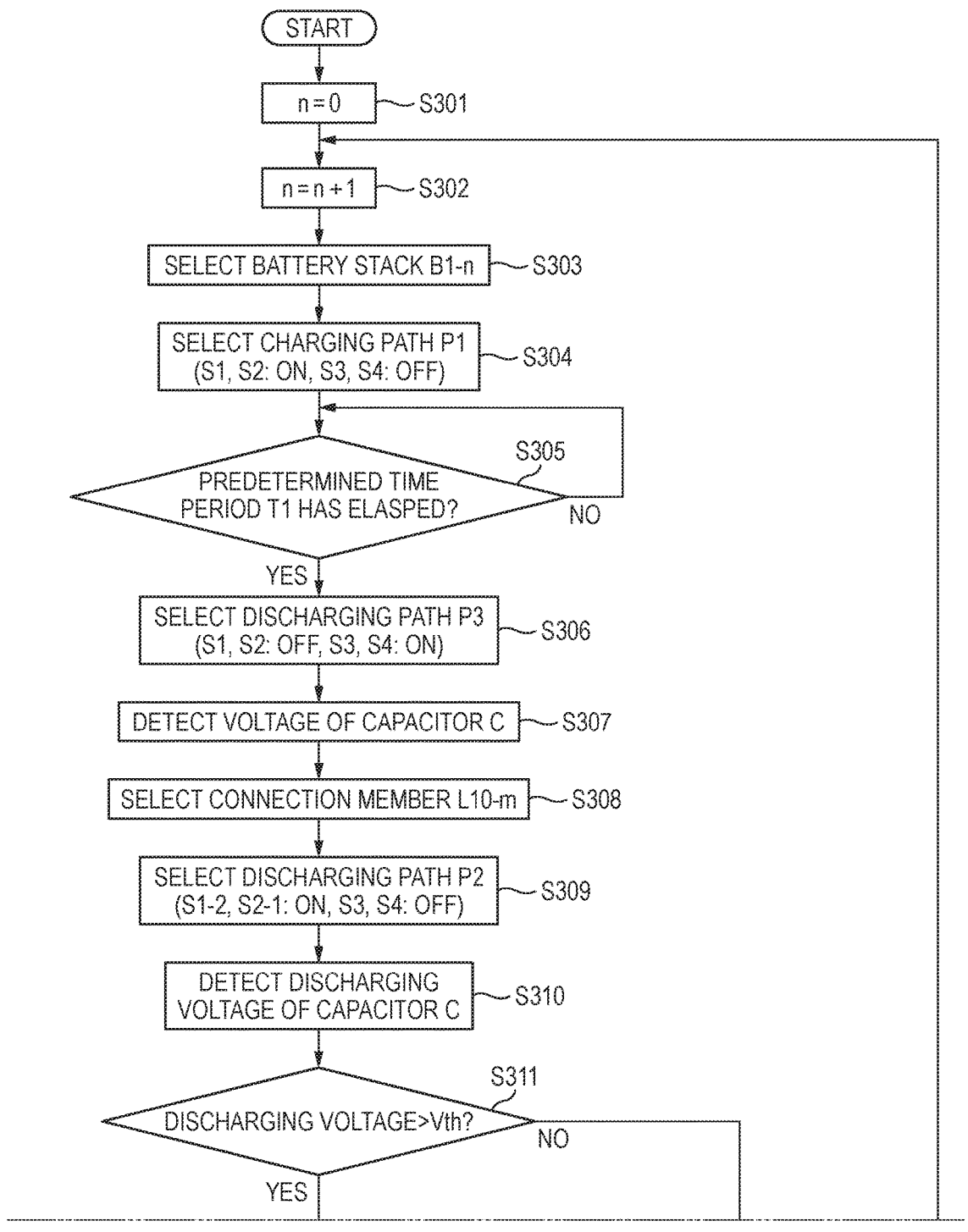
FIG. 25 is a flowchart depicting another example of the processing sequence of the abnormality determination processing.

Another example of the abnormality determination processing that is to be executed by the control unit 30 is described with reference to FIG. 25. FIG. 25 is a flowchart depicting another example of the processing sequence of the abnormality determination processing. In the abnormality determination processing of FIG. 25, the control unit 30 determines that the open abnormality has occurred, when the number of times that the discharging voltage of the capacitor C exceeds the threshold Vth reaches a plurality of times. In the meantime, since the processing of step S301 to step S311 is the same as the abnormality determination processing shown in FIG. 24, the descriptions thereof are omitted.

The control unit 30 has an abnormality counter S1 configured to count the number of times that the discharging voltage of the capacitor C exceeds the threshold Vth and a normality counter S2 configured to count the number of times that the discharging voltage is equal to or less than the threshold Vth. When the discharging voltage of the capacitor C is greater than the threshold Vth (Yes in step S311), the control unit 30 adds '1' to a value of the abnormality counter S1, and initializes a value of the normality counter S2 to zero (0) (step S314).

Then, the control unit 30 compares the abnormality counter S1 and a threshold TH1 (step S315). As a result of the comparison, when the abnormality counter S1 is equal to or greater than the threshold TH1 (Yes in step S315), the control unit 30 determines that the open abnormality has occurred in the battery pack 1 (step S316), resets the values of the abnormality counter S1 and the normality counter S2, and ends the abnormality determination processing. On the other hand, when the abnormality counter S1 is less than the threshold TH1 (No in step S315), the control unit 30 proceeds to step S313.

Then, when the discharging voltage of the capacitor C is equal to or less than the threshold Vth (No in step S311), the control unit 30 initializes the value of the abnormality counter S1 to zero (0), and adds '1' to the value of the normality counter S2 (step S317). The control unit 30 compares the normality counter S2 and a threshold TH2 (step S318).

As a result of the comparison, when the normality counter S2 is equal to or greater than the threshold TH2 (Yes in step S318), the control unit 30 determines that the open abnormality has not occurred in the battery pack 1 and the battery pack 1 is thus normal (step S319), resets the values of the abnormality counter S1 and the normality counter S2 and proceeds to step S313. On the other hand, when the normality counter S2 is less than the threshold TH2 (No in step S318), the control unit 30 proceeds to step S313.

In this way, when the discharging voltage of the capacitor C exceeds the threshold Vth more than once, the control unit 30 determines that the open abnormality has occurred, so that it is possible to suppress the erroneous determination as to the open abnormality by the control unit 30.

In the abnormality determination processing of FIG. 25, when the value of the abnormality counter S1 or the normality counter S2 is increased by '1', the control unit 30 proceeds to step S313 unless it is determined in step S316 that the abnormality has occurred. However, the abnormality determination processing of the second illustrative embodiment is not limited thereto. For example, when it is determined in step S319 that the battery pack is normal, the control unit 30 may proceed to step S313, and may return to step S305 in other cases (No in step S315, No in step S318). In this way, after it is determined whether the open abnormality has occurred in the connection member L10-$m$ selected in step S307, the control unit 30 may select a next connection member L10-($m$+1).

In the meantime, according to the abnormality determination processing shown in FIGS. 24 and 25, the voltage detection processing of detecting the voltages of the battery stack B1 is executed at the same time. However, the detection of the voltages of the battery stack B1 is not necessarily required. The control unit 30 may be configured to determine whether the charges being charged to the capacitor C is being discharged through the discharging path P2. For example, the capacitor C may be charged using a battery (not shown) different from the battery pack 1.

Also, according to the abnormality determination processing, the abnormality determination is performed at the timing of detecting the voltage of the battery stack B1. However, the execution timing of the abnormality determination processing is not limited thereto. For example, the abnormality determination processing may be performed upon shipment of the battery pack system 100 or a charging/discharging system ST1 (refer to FIG. 26) or upon input of power supply and may be performed at a predetermined interval.

<Applications to Charging/Discharging System>

Figure 26:
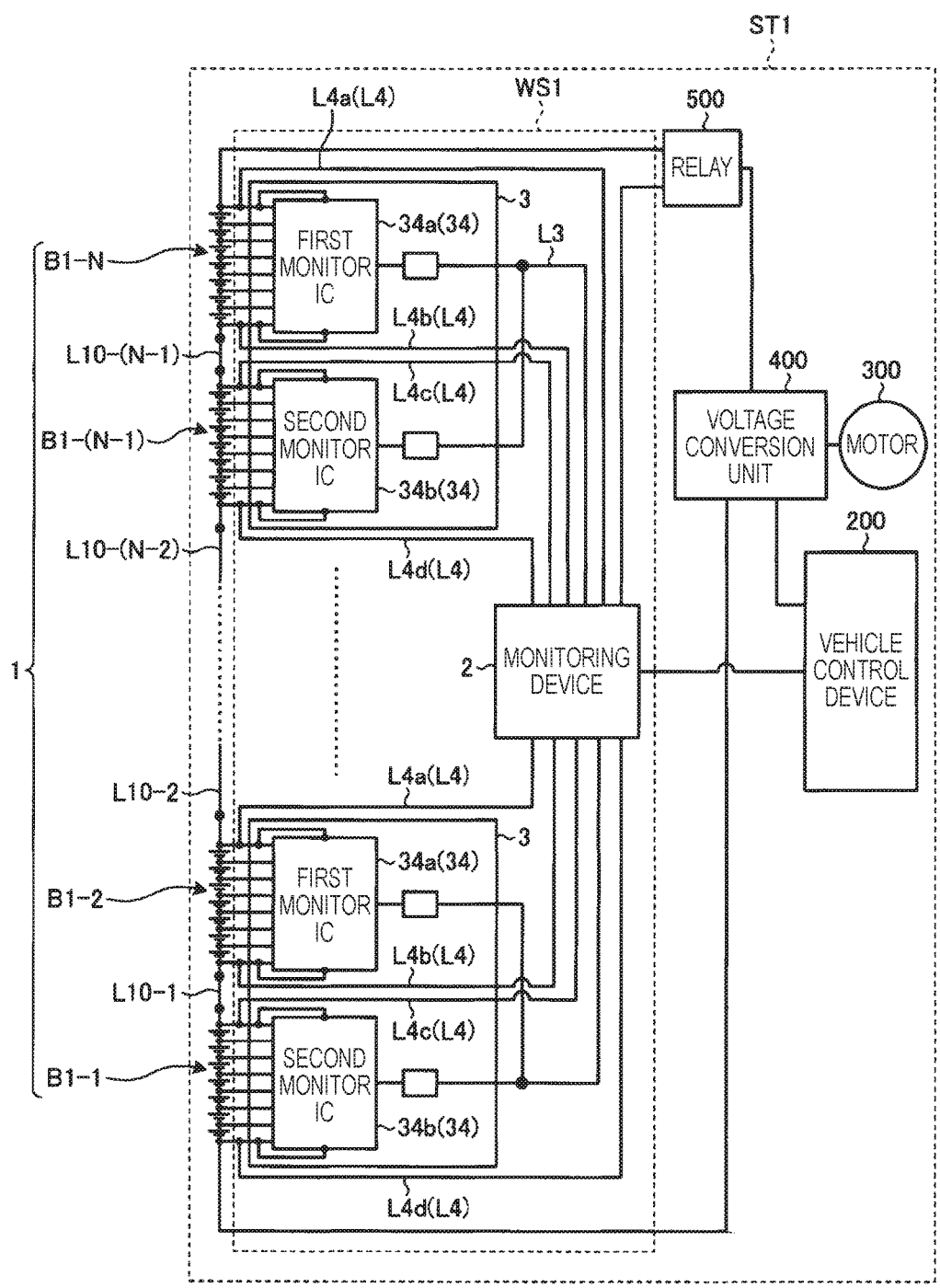
FIG. 26 depicts an outline of a charging/discharging system.

Subsequently, an example where the battery pack system 100 is applied to a charging/discharging system ST1 is described with reference to FIG. 26. FIG. 26 depicts an outline of the charging/discharging system ST1. The charging/discharging system ST1 shown in FIG. 26 is used as a power supply for driving a vehicle such as a hybrid electric vehicle (HEV), an electric vehicle (EV) and a fuel cell vehicle (FCV).

The charging/discharging system ST1 is a system including the battery pack 1, a battery monitoring system WS1, a vehicle control device 200, a motor 300, a voltage converter 400 and a relay 500. Also, the battery monitoring system WS1 is a system including a plurality of satellite substrates 3 having a monitor IC 34 and the like, and a monitoring device 2. Also, the battery pack 1 and the monitoring device 2 included in the charging/discharging system ST1 correspond to the battery pack system 100 shown in FIG. 1.

The battery pack 1 shown in FIG. 26 is a battery insulated from a vehicle body, and is configured by a plurality of blocks. In one block, 16 battery cells are connected each other in series, and the 16 battery cells are electrically connected to the monitor IC 34 provided on the one satellite substrate 3. For this reason, a voltage of each battery cell in the one block is measured by the monitor IC 34 provided on the one satellite substrate 3.

In the meantime, the one satellite substrate 3 is provided with two monitor ICs of a first monitor IC 34a and a second monitor IC 34b, and the first monitor IC 34a and the second monitor IC 34b are respectively responsible for each group consisting of 8 battery cells of the one block. In the meantime, the group configured by the 8 battery cells corresponds to the battery stack B1 shown in FIG. 1. Also, the connection member L10-m is configured to electrically connect the adjacent battery stacks B1 of the plurality of battery stacks B1-n.

The monitoring device 2 is configured to monitor an individual voltage of each of the plurality of battery cells and to monitor a voltage of each battery stack B1. That is, the monitoring device 2 is configured to monitor a charging status of the battery pack 1. Specifically, the monitor IC 34 is configured to measure an individual voltage (hereinafter, referred to as 'cell voltage') of each of the plurality of battery cells on the basis of a voltage measuring request received from the monitoring device 2 through a communication line L3, and to transmit a measurement result to the monitoring device 2 through the communication line L3.

The monitoring device 2 is configured to receive the cell voltage from the monitor IC 34, to charge the capacitor C (refer to FIG. 1) with the voltage (hereinafter, referred to as 'stack voltage') of the battery stack B1 through a communication line L4, to directly measure the stack voltage and to monitor the charging status. In this way, the monitoring device 2 is configured to operate as a monitoring device configured to monitor the charging status of the battery pack 1 and to operate as a voltage detection device configured to detect the stack voltage.

The monitoring device 2 is also configured to operate as a determination device configured to determine whether the monitor IC 34 is normally operating. For example, the monitoring device 2 is configured to compare a stack voltage, which is calculated by adding the individual voltage of each battery cell received from the monitor IC 34, and the directly detected stack voltage. As a result of the comparison, when a difference thereof is greater than an allowed value, the monitoring device 2 determines that the monitor IC 34 is abnormal. When it is determined that the monitor IC 34 is abnormal, the monitoring device 2 executes a fail safe function.

Also, as described above, the monitoring device 2 is configured to operate as an abnormality determination device configured to determine whether the open abnormality has occurred in the battery pack 1. When it is determined that the open abnormality has occurred in the battery pack 1, the monitoring device 2 executes the fail safe function. For example, the monitoring device 2 is configured to execute a fail safe function of isolating the relay 500 so as not to charge/discharge the battery cell.

The vehicle control device 200 is configured to charge/discharge the battery pack 1, in correspondence to the charging status of the battery pack 1. Specifically, when the battery pack 1 is overcharged, the vehicle control device 200 converts the voltage charged in the battery pack 1 from the direct current voltage to the alternating current voltage by using the voltage converter 400, and drives the motor 300. As a result, the voltage of the battery pack 1 is discharged.

Also, when the battery pack 1 is over-discharged, the vehicle control device 200 converts the voltage, which is generated by the motor 300, from the alternating current voltage to the direct current voltage by regenerative braking using the voltage converter 400. As a result, the battery pack 1 is charged with the voltage. In this way, the vehicle control device 200 is configured to monitor the voltage of the battery pack 1 on the basis of the charging status of the battery pack 1 acquired from the monitoring device 2 and to execute the control corresponding to the monitoring result.

As described above, the monitoring device 2 of the first illustrative embodiment is configured to determine whether the connection member L10 and the first and second switches S1, S2 are abnormal, in correspondence to at least one of the charging voltage of the capacitor C by the battery stack B1 of which a voltage is to be detected and the discharging voltage through the first discharging path P2 including the connection member L10. Thereby, it is not necessary to separately provide a circuit element for determining an abnormality and it is possible to suppress the increase in the number of components of the monitoring device 2. That is, it is possible to suppress the increase in the circuit scale of the monitoring device 2 and the increase in the manufacturing cost.

As described above, the monitoring device 2 of the second illustrative embodiment is configured to select the discharging path P3 including the connection member L10 and to determine whether the open abnormality has occurred in the connection member L10 on the basis of the voltage of the capacitor C after the discharging. Thereby, it is not necessary to separately provide a circuit element for determining an abnormality and it is possible to suppress the increase in the number of components of the monitoring device 2. That is, it is possible to suppress the increase in the circuit scale of the monitoring device 2 and the increase in the manufacturing cost.

Also, when the monitoring device 2 is applied to the charging/discharging system ST1 that is to be used as the power supply for driving a vehicle such as a hybrid electric vehicle, for example, it is possible to suppress the increase in the number of components of the charging/discharging system ST1.

Also, instead of configuration where the monitoring device 2 and the satellite substrate 3 are separately provided, they may be integrally provided.

Also, the battery stack has been described to have the plurality of battery cells. However, the battery stack may be referred to as a battery block when it has a plurality of battery cells.

The additional effects and modified embodiments can be easily conceived by one skilled in the art. For this reason, the broader aspect of the disclosure is not limited to the above descriptions and illustrations and the representative illustrative embodiments. Therefore, it is possible to make a variety of changes without departing from the spirit and scope of the general concepts of the disclosure defined by the claims and equivalents thereof.

What is claimed is:

1. A voltage detection device configured to detect a voltage of a battery stack of a battery pack comprising a plurality of battery stacks, each of the plurality of battery stacks having a plurality of battery cells connected in series, the voltage detection device comprising:
   a capacitor configured to be selectively provided as a parallel circuit to each of the plurality of battery stacks;
   a plurality of switches, each of the plurality of switches having one end provided so as to be electrically connected to a terminal of each of the plurality of battery stacks and the other end provided so as to be electrically connected to the capacitor, the capacitor being connected to the plurality of battery stacks by the plurality of switches;
   at least one connection member, each connection member being configured to be provided between respective battery stacks of the plurality of battery stacks and configured to be connected to at least one of the plurality of switches;
   a detection unit configured to detect a voltage of the capacitor; and
   a control unit configured to control the plurality of switches,
   wherein the control unit comprises:
   a discharging path selection unit that selects a discharging path comprising the connection member and the capacitor, by switching the plurality of switches, when discharging the capacitor, and
   a determination unit configured to determine that an abnormality has occurred in the battery pack or at least one of the plurality of switches when at least one of a voltage of the capacitor after charging and a voltage of the capacitor after discharging is less than or equal to a predetermined threshold.

2. The voltage detection device according to claim 1, wherein when the voltage of the capacitor after discharging is equal to or less than a predetermined threshold and the voltage of the capacitor after charging is equal to or less than the predetermined threshold, the determination unit determines that an open abnormality has occurred in a switch of the plurality of switches connected to the battery stack of which a voltage is to be detected, the switch being included on a charging path comprising the battery stack and the capacitor and not being included on the discharging path, and the open abnormality indicating that the switch is kept at an off state.

3. The voltage detection device according to claim 2, wherein when the voltage of the capacitor after discharging is within a defined range comprising a voltage of the battery stack, the determination unit determines that the open abnormality has occurred in the connection member or at least one of the plurality of switches included on the discharging path.

4. The voltage detection device according to claim 3, further comprising:
   a discharging circuit configured to discharge the capacitor, and
   a charging path selection unit configured to select a charging path comprising the capacitor and a battery stack to be connected to the connection member included on the discharging path,
   wherein when the voltage of the capacitor after discharging is within the defined range, the discharging path selection unit selects a second discharging path comprising the discharging circuit and the capacitor, and
   the determination unit is configured to determine whether an abnormality has occurred in the connection member or any one of the plurality of switches included on the discharging path, based on a voltage of the capacitor charged through the charging path after discharging the capacitor through the second discharging path.

5. The voltage detection device according to claim 4, wherein when the voltage of the capacitor charged through the charging path after discharging the capacitor through the second discharging path is equal to or less than the predetermined threshold, the determination unit determines that the open abnormality has occurred in the switch included on the discharging path and on the charging path.

6. The voltage detection device according to claim 4, wherein when the voltage of the capacitor charged through the charging path comprising the battery stack to be connected to one side of the connection member after discharging the capacitor through the second discharging path is within the defined range and the voltage of the capacitor charged through the charging path comprising the battery stack to be connected to the other side of the connection member after discharging the capacitor through the second discharging path is within the defined range, the determination unit determines that an open abnormality of disconnection has occurred in the connection member included on the discharging path.

7. The voltage detection device according to claim 3, wherein when the voltage of the capacitor after charging the capacitor is beyond the defined range, the determination unit determines that a short abnormality has occurred in at least one of the plurality of switches, the short abnormality indicating that the switch is kept at an on state.

8. The voltage detection device according to claim 7, wherein when the voltage of the capacitor after charging the capacitor is within a first range greater than the defined range, the determination unit determines that the short abnormality has occurred in a switch of the plurality of switches, which is connected to the battery stack of which a voltage is to be detected via a battery stack adjacent to the battery stack of which a voltage is to be detected.

9. The voltage detection device according to claim 7, wherein when the voltage of the capacitor after charging the capacitor is within a second range smaller than the defined range and greater than the predetermined threshold, the determination unit determines that the short abnormality has occurred in a switch of the plurality of switches, which is connected to the battery stack of which a voltage is to be detected via the connection member.

10. A voltage detection method of detecting a voltage of a battery stack of a battery pack comprising a plurality of battery stacks, each of the plurality of battery stacks having a plurality of battery cells connected in series, the voltage detection method comprising:
   controlling a plurality of switches, each of the plurality of switches having one end provided so as to be electrically connected to a terminal of each of the plurality of battery stacks and the other end provided so as to be electrically connected to a capacitor, the capacitor being configured to be selectively provided as a parallel circuit to each of the plurality of battery stacks, and the capacitor being connected to the plurality of battery stacks by the plurality of switches;
   detecting a voltage of the capacitor;
   when discharging the capacitor, selecting a discharging path comprising at least one connection member, each connection member being configured to be provided between respective battery stacks of the plurality of battery stacks and configured to be connected to at least one of the plurality of switches and the capacitor, by switching the plurality of switches, and determining that an abnormality has occurred in the battery pack or at least one of the plurality of switches when at least one of a voltage of the capacitor after charging and a voltage of the capacitor after discharging is less than or equal to a predetermined threshold.

11. An abnormality determination device configured to determine whether an abnormality has occurred in a battery pack comprising a plurality of battery stacks, each of the plurality of battery stacks having a plurality of battery cells connected in series, the abnormality determination device comprising:

a capacitor configured to be selectively provided as a parallel circuit to the plurality of battery stacks;

a plurality of switches, each of the plurality of switches having one end provided so as to be electrically connected to a terminal of each of the plurality of battery stacks and the other end provided so as to be electrically connected to the capacitor, the capacitor being connected to the plurality of battery stacks by the plurality of switches;

at least one connection member, each connection member being configured to be provided between respective battery stacks of the plurality of battery stacks and configured to be connected to at least one of the plurality of switches;

a detection unit configured to detect a voltage between both ends of the capacitor;

a charging path selection unit that selects a charging path of the capacitor, by switching the plurality of switches, when charging the capacitor;

a discharging path selection unit that selects a discharging path comprising the connection member and the capacitor when discharging the capacitor; and a determination unit configured to determine that an abnormality has occurred in the battery pack, based on pack when a voltage of the capacitor after discharging the capacitor is less than or equal to a predetermined threshold.

12. The abnormality determination device according to claim 11, wherein the determination unit determines that an abnormality has occurred in the connection member included on the discharging path, when a voltage of the capacitor is greater than a threshold.

13. The abnormality determination device according to claim 11, further comprising:

a selection unit configured to select any one of a first discharging path having a first discharging time constant and configured to supply discharging current from the capacitor and a second discharging path having a second discharging time constant smaller than the first discharging time constant and configured to supply discharging current from the capacitor, wherein the selection unit selects the first discharging path before voltage detection of the capacitor is completed and switches the discharging path to the second discharging path after voltage detection of the capacitor is completed, and the determination unit determines whether an abnormality has occurred in the battery pack, after the discharging path is switched to the second discharging path.

14. The abnormality determination device according to claim 13, wherein the second discharging path is a discharging path comprising the capacitor and a connection member configured to electrically connect two adjacent battery stacks of the plurality of battery stacks.

15. The abnormality determination device according to claim 11, wherein when discharging the capacitor more than once, the determination unit determines whether an abnormality has occurred in the battery pack, based on a voltage after each discharging.

16. The abnormality determination device according to claim 11, wherein the determination unit is configured to determine whether an abnormality has occurred in the battery pack, based on a comparison result of a summed value of respective voltages of the plurality of battery cells and a voltage detected by the detection unit.

* * * * *